US012775452B2

(12) United States Patent
Siebel et al.

(10) Patent No.: US 12,775,452 B2
(45) Date of Patent: Oct. 27, 2026

(54) SYSTEMS AND METHODS FOR UTILIZING MACHINE LEARNING TO IDENTIFY NON-TECHNICAL LOSS

(71) Applicant: C3.ai, Inc., Redwood City, CA (US)

(72) Inventors: Thomas M. Siebel, Woodside, CA (US); Edward Y. Abbo, Woodside, CA (US); Houman Behzadi, San Francisco, CA (US); Avid Boustani, Redwood City, CA (US); Nikhil Krishnan, Los Altos, CA (US); Kuenley Chiu, San Francisco, CA (US); Henrik Ohlsson, San Francisco, CA (US); Louis Poirier, San Francisco, CA (US); Jeremy Kolter, Pittsburgh, PA (US)

(73) Assignee: C3.ai, Inc., Redwood City, CA (US)

( * ) Notice: Subject to any disclaimer, the term of this patent is extended or adjusted under 35 U.S.C. 154(b) by 412 days.

(21) Appl. No.: 18/491,875

(22) Filed: Oct. 23, 2023

(65) Prior Publication Data

US 2024/0045659 A1 Feb. 8, 2024

Related U.S. Application Data

(63) Continuation of application No. 17/816,520, filed on Aug. 1, 2022, now Pat. No. 11,886,843, which is a (Continued)

(51) Int. Cl.
*G06F 8/34* (2018.01)
*G01R 21/00* (2006.01)
(Continued)

(52) U.S. Cl.
CPC ............... *G06F 8/34* (2013.01); *G01R 21/00* (2013.01); *G06N 20/00* (2019.01); *G06Q 50/06* (2013.01); *H04B 17/391* (2015.01); *H04W 52/04* (2013.01)

(58) Field of Classification Search
CPC ....... G06N 20/00; G06Q 50/06; H04W 52/04; H04B 17/391; G06F 8/34; G01R 21/00
See application file for complete search history.

(56) References Cited

U.S. PATENT DOCUMENTS

| | | |
|---|---|---|
| 8,768,795 B2 | 7/2014 | Garrity et al. |
| 9,013,283 B1 | 4/2015 | Tackaberry |

(Continued)

FOREIGN PATENT DOCUMENTS

| | | |
|---|---|---|
| CN | 1649311 A | 8/2005 |
| CN | 102016748 A | 4/2011 |

(Continued)

OTHER PUBLICATIONS

Depuru, Soma Shekara Sreenadh Reddy et al.; "Smart meters for power grid: Challenges, issues, advantages and status"; Elsevier; Renewable and Sustainable Energy Reviews 15 (2011) 2736-2742. (Year: 2011).

(Continued)

*Primary Examiner* — Congvan Tran
(74) *Attorney, Agent, or Firm* — Nicholson De Vos Webster & Elliott LLP

(57) ABSTRACT

Various embodiments of the present disclosure can include systems, methods, and non-transitory computer readable media configured to select a set of signals relating to a plurality of energy usage conditions. Signal values for the set of signals can be determined. Machine learning can be applied to the signal values to identify energy usage conditions associated with non-technical loss.

29 Claims, 8 Drawing Sheets

Related U.S. Application Data continuation of application No. 16/376,976, filed on Apr. 5, 2019, now Pat. No. 11,449,315, which is a continuation of application No. 14/495,848, filed on Sep. 24, 2014, now Pat. No. 10,296,843.

(51) Int. Cl.

| | |
|---|---|
| ***G06N 20/00*** | (2019.01) |
| ***G06Q 50/06*** | (2012.01) |
| ***H04B 17/391*** | (2015.01) |
| ***H04W 52/04*** | (2009.01) |

(56) References Cited

U.S. PATENT DOCUMENTS

| | | | | |
|---|---|---|---|---|
| 9,092,741 | B1 | 7/2015 | Goparaju et al. | |
| 9,438,312 | B2 * | 9/2016 | Bernheim | H04B 3/546 |
| 10,296,843 | B2 | 5/2019 | Siebel et al. | |
| 10,749,571 | B2 * | 8/2020 | Hansell | G01R 21/00 |
| 2010/0280978 | A1 | 11/2010 | Shimada et al. | |
| 2011/0231316 | A1 | 9/2011 | Carroll, III | |
| 2011/0282508 | A1 | 11/2011 | Goutard et al. | |
| 2012/0143383 | A1 * | 6/2012 | Cooperrider | H04Q 9/00 700/295 |
| 2013/0035802 | A1 | 2/2013 | Khaitan et al. | |
| 2013/0124436 | A1 | 5/2013 | Cardenas Mora et al. | |
| 2014/0074670 | A1 | 3/2014 | Garrity et al. | |
| 2014/0236506 | A1 | 8/2014 | Nikovski et al. | |
| 2014/0280208 | A1 | 9/2014 | McConky et al. | |
| 2014/0310138 | A1 | 10/2014 | Garrity et al. | |
| 2014/0358839 | A1 | 12/2014 | Dhurandhar et al. | |
| 2015/0042488 | A1 | 2/2015 | Bell | |
| 2015/0196002 | A1 | 7/2015 | Friesth | |
| 2015/0377979 | A1 * | 12/2015 | Barth | G01R 31/3646 324/433 |
| 2016/0247084 | A1 * | 8/2016 | Miller | G06F 16/254 |
| 2016/0253614 | A1 * | 9/2016 | Miller | G06Q 10/06395 705/7.41 |
| 2017/0082665 | A1 * | 3/2017 | Bandyopadhyay | G01R 22/10 |

FOREIGN PATENT DOCUMENTS

| | | | |
|---|---|---|---|
| CN | 102866321 | A | 1/2013 |
| CN | 103069748 | A | 4/2013 |
| CN | 103635910 | A | 3/2014 |
| CN | 103942453 | A | 7/2014 |
| CN | 111366889 | A | 7/2020 |
| EP | 2458340 | A2 | 5/2012 |
| JP | 2015529926 | A | 10/2015 |
| WO | WO-2014043287 | A2 | 3/2014 |
| WO | WO-2014080515 | A1 | 5/2014 |
| WO | WO-2014129058 | A1 | 8/2014 |
| WO | WO-2016049369 | A1 | 3/2016 |

OTHER PUBLICATIONS

EP15843835.8—PACE Request filed with EPO on Sep. 18, 2023.
EP15843835.8 Extended European Search Report dated Apr. 6, 2018.
Jiang, Rong et al.; "Energy-Theft Detection Issues for Advanced Metering Infrastructure in Smart Grid"; 2014; Tsinghua Science and Technology; vol. 19, No. 2; pp. 105-120. (Year: 2014).
Monedero, Inigo et al.; "MIDAS: Detection of Non-technical Losses in Electrical Consumption Using Neural Networks and Statistical Techniques"; 2006; Springer-Verlag; ICCSA 2006, LNCS 3984; pp. 725-734. (Year: 2006).
Nagi, J et al.; "Non-Technical Loss Analysis for Detection of Electricity Theft using Support Vector Machines"; 2008; IEEE; 2nd IEEE International Conference on Power and Energy; pp. 907-912.
Nizar, A. H. et al.; "A Data Mining Based NTL Analysis Method"; 2007; IEEE; pp. 1-8. (Year: 2007).
Nizar, A. H. et al.; "Identification and Detection of Electricity Customer Behaviour Irregularities"; 2009; IEEE; pp. 1-10. (Year: 2009).
Nizar, A. H. et al.; "Load Profiling Method in Detecting non-Technical Loss Activities in a Power Utility"; 2006; IEEE; First International Power and Energy Conference; pp. 82-87. (Year: 2006).
Nizar, A. H. et al.; "Power Utility Nontechnical Loss Analysis With Extreme Learning Machine Method"; 2008 IEEE Transactions on Power Systems, vol. 23, No. 3; pp. 946-955. (Year: 2008).
Nizar, Anisah H. et al.; "Detection Rules for Non Technical Losses Analysis in Power Utilities"; 2008; IEEE; pp. 1-8. (Year: 2008).
PCT/US2015/052048 International Search Report and Written Opinion dated Dec. 28, 2015.
Ramos, Caio Cesar Oba et al. "A New Approach for Nontechnical Losses Detection Based on Optimum-Path Forest"; 2011; IEEE Transactions on Power Systems, vol. 26, No. 1; pp. 181-189. (Year: 2011).
Ramos, Caio C. O. et al. "A Novel Algorithm for Feature Selection Using Harmony Search and its Application for Non-technical Losses Detection," Computers & Electrical Engineering, vol. 37, Issue 6, Nov. 2011, pp. 886-894, 9 pages.
U.S. Appl. No. 14/495,848 Notice of Allowance dated Mar. 20, 2019.
U.S. Appl. No. 14/495,848 Office Action dated Dec. 27, 2018.
U.S. Appl. No. 14/495,848 Office Action dated May 2, 2018.
Office Action dated Sep. 14, 2017 for U.S. Appl. No. 14/495,848.
China National Intellectual Property Administration; Office Action issued for Chinese Patent Application No. 202110829239.X, dated Aug. 29, 2024, 28 pages with English language translation.

* cited by examiner

500

| Signal # | Signal Name | Signal Value |
| --- | --- | --- |
| Signal A | Consumption Drop | 0.82 |
| Signal B | Line Outage Event | 0.74 |
| ⋮ | | |
| Signal N | Cancellation of Work Order | 0.91 |

FIGURE 5

SYSTEMS AND METHODS FOR UTILIZING MACHINE LEARNING TO IDENTIFY NON-TECHNICAL LOSS

PRIORITY

This application is a continuation of U.S. application Ser. No. 17/816,520, filed Aug. 1, 2022, which is a continuation of U.S. application Ser. No. 16/376,976, filed Apr. 5, 2019, and issued Aug. 31, 2022 as U.S. Pat. No. 11,449,315, which is a continuation of U.S. application Ser. No. 14/495,848, filed Sep. 24, 2014, and issued May 1, 2019 as U.S. Pat. No. 10,296,843, each of which is incorporated herein by reference in its entirety.

FIELD OF THE INVENTION

The present technology relates to the field of energy management. More particularly, the present technology provides techniques for utilizing machine learning to identify non-technical loss (NTL).

BACKGROUND

Conventional energy management tools are intended to help companies track energy usage. For example, such tools may collect certain types of energy-related information, including billing statements and energy meter readings. The collected information may be used to understand or analyze energy usage. Such tools may also generate reports that detail energy-related information and usage.

In some cases, an energy provider (e.g., utility company) may face challenges associated with loss of energy provided, such as technical loss and non-technical loss (NTL). Technical loss can include loss of energy during normal usage due to expected or natural limitations, such as the loss of power due to resistances in cables, wires, power-lines, etc. Non-technical loss can include one or more losses not due to such limitations. Non-technical loss can be associated with irregular (or undesired) energy usage, such as, for example, loss in the form of energy theft or malfunctions in energy distribution systems.

Non-technical loss can be costly for the energy provider. Conventional approaches to detecting non-technical loss often require significant manual effort. Moreover, conventional approaches can also be inaccurate, inefficient, or ineffective. As such, cases of non-technical loss are often overlooked, undetected, misdiagnosed, or otherwise insufficiently addressed. These and other concerns can create challenges for energy providers as well as for their customers.

SUMMARY

Various embodiments of the present disclosure can include systems, methods, and non-transitory computer readable media configured to select a set of signals relating to a plurality of energy usage conditions. Signal values for the set of signals can be determined. Machine learning can be applied to the signal values to identify energy usage conditions associated with non-technical loss.

In an embodiment, a plurality of N-dimensional representations can be generated for the plurality of energy usage conditions. The plurality of N-dimensional representations can be generated based on the signal values. The application of machine learning can include applying at least one machine learning algorithm to the plurality of N-dimensional representations to produce a classifier model for identifying non-technical loss.

In an embodiment, at least a first portion of the plurality of N-dimensional representations can be previously recognized as corresponding to non-technical loss. At least a second portion of the plurality of N-dimensional representations can be previously recognized as corresponding to normal energy usage.

In an embodiment, at least one machine learning algorithm can include a supervised process that classifies at least a third portion of the plurality of N-dimensional representations within an allowable N-dimensional proximity from the first portion as corresponding to non-technical loss. The supervised process can also classify at least a fourth portion of the plurality of N-dimensional representations within the allowable N-dimensional proximity from the second portion as corresponding to normal energy usage.

In an embodiment, new signals values for the set of signals can be received. The new signal values can be associated with a particular energy usage condition. A new N-dimensional representation can be generated for the particular energy usage condition based on the new signal values. The new N-dimensional representation can be classified based on the classifier model.

In an embodiment, the at least one machine learning algorithm can be applied to the new N-dimensional representation to modify the classifier model.

In an embodiment, the new N-dimensional representation can be identified as corresponding to non-technical loss. The non-technical loss can be reported to an energy provider associated with the particular energy usage condition.

In an embodiment, at least one of a confirmation or a non-confirmation that the particular energy usage condition is associated with the non-technical loss can be acquired from the one or more entities.

In an embodiment, the classifier model can be modified based on the at least one of the confirmation or the non-confirmation.

In an embodiment, the at least one machine learning algorithm can be associated with at least one of a support vector machine, a boosted decision tree, a classification tree, a regression tree, a bagging tree, a random forest, a neural network, or a rotational forest.

In an embodiment, a plurality of utility meters that have likelihoods of being associated with the non-technical loss can be identified. The plurality of utility meters can be ranked based on the likelihoods of being associated with the non-technical loss.

In an embodiment, it can be determined that at least some of the plurality of meters meet specified ranking threshold criteria. The at least some of the plurality of meters can be identified as candidates for investigation.

In an embodiment, one or more signals in the set of signals can be associated with at least one of an account attribute signal category, an anomalous load signal category, a calculated status signal category, a current analysis signal category, a missing data signal category, a disconnected signal category, a meter event signal category, a monthly meter anomalous load signal category, a monthly meter consumption on inactive signal category, an outage signal category, a stolen meter signal category, an unusual production signal category, a work order signal category, or a zero reads signal category.

In an embodiment, a set of formulas for the set of signals can be acquired. Each formula in the set of formulas can correspond to a respective signal in the set of signals. The signal values for the set of signals can be calculated based on the set of formulas.

In an embodiment, at least some signal values can be derived from data acquired from a plurality of meters associated with the plurality of energy usage conditions.

In an embodiment, a first signal in the set of signals can be generated based on a modification to a second signal in the set of signals.

In an embodiment, at least one signal, not included in the set of signals, relating to energy usage conditions can be received from an energy provider to identify non-technical loss.

In an embodiment, the at least one machine learning algorithm can include an unsupervised process. In some instances, the unsupervised process can utilize unclassified data for identifying non-technical loss.

Many other features and embodiments of the disclosed technology will be apparent from the accompanying drawings and from the following detailed description.

BRIEF DESCRIPTION OF THE DRAWINGS

FIG. 5 illustrates an example table including example signal values for an example set of signals, in accordance with an embodiment of the present disclosure.

Figure 1:
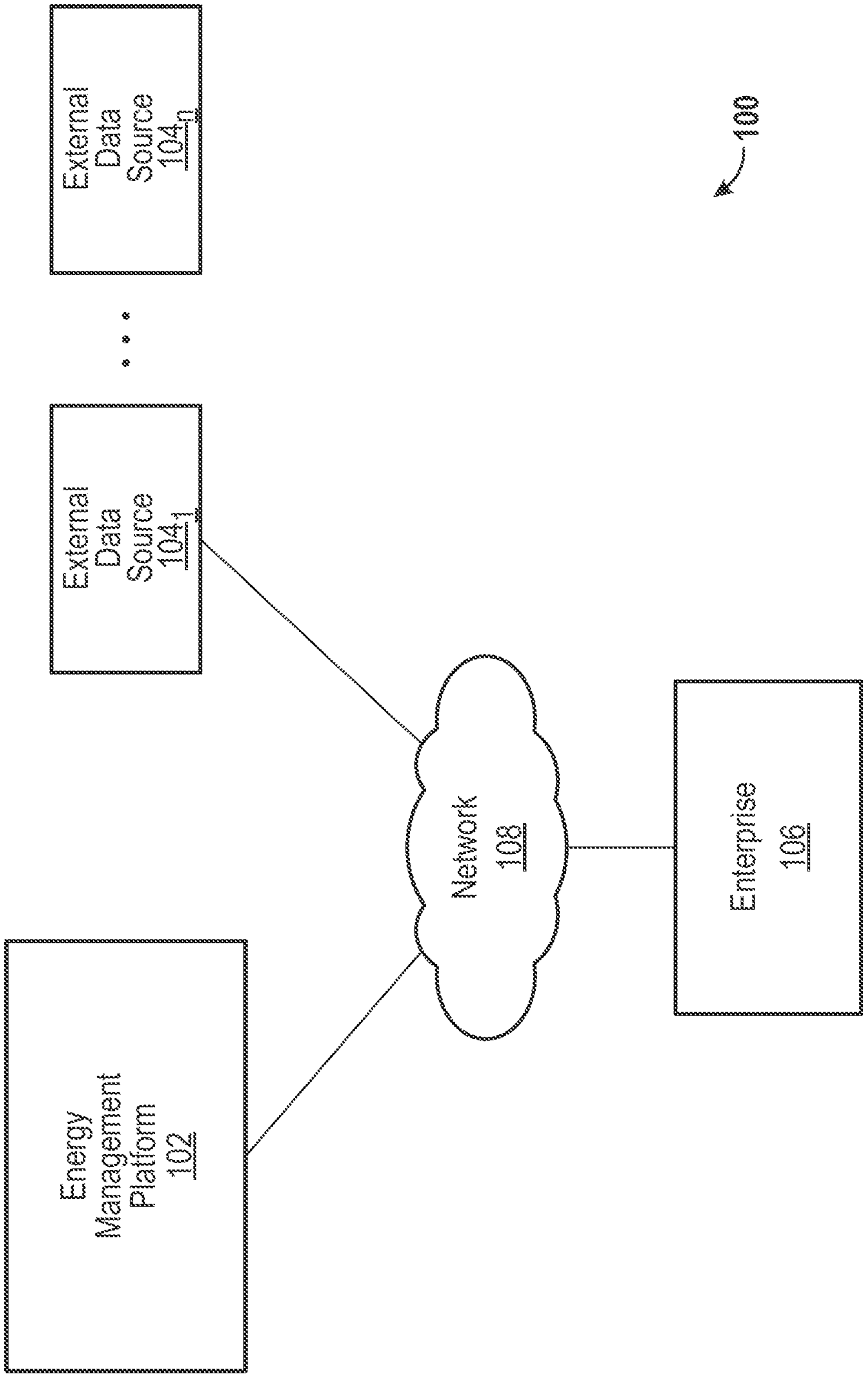
FIG. 1 illustrates an example environment of an energy management platform, in accordance with an embodiment of the present disclosure.

The figures depict various embodiments of the present disclosure for purposes of illustration only, wherein the figures use like reference numerals to identify like elements. One skilled in the art will readily recognize from the following discussion that alternative embodiments of the structures and methods illustrated in the figures may be employed without departing from the principles of the disclosed technology described herein.

DETAILED DESCRIPTION

Energy is consumed or used every day for a wide variety of purposes. In one example, consumers can use gas to power various appliances at home and businesses can use gas to operate various machinery. In another example, consumers and businesses can use electricity to power various electronic appliances and other electrical devices and components. Energy consumption is facilitated by energy providers who supply energy to meet demand.

Energy providers, such as utility companies, can provide one or more forms of energy, such as gas and electricity. Energy providers can utilize energy distribution systems to provide or delivery energy to their intended customers or users. In some cases, there can be a loss of energy during delivery. For example, even in normal usage, there can be resistances in power-lines, cables, and/or wires, etc., such that electrical energy is lost during delivery through these channels. Such energy loss is attributable to expected or natural causes and can be referred to as technical loss. In some cases, however, there can be a loss of energy other than technical loss. Energy can be lost due to irregular or undesired energy usage. For example, energy can be lost due to theft and/or malfunctions in energy distribution systems and their distribution nodes (e.g., malfunctioning utility meters). Such energy loss can be referred to as non-technical loss (NTL).

Energy loss, such as non-technical loss (NTL), can be costly to the energy providers. However, conventional approaches that attempt to detect, prevent, and reduce non-technical loss are problematic. Often times, conventional approaches require significant manual effort to analyze information in an attempt to detect non-technical loss, such as due to theft or utility meter malfunction. Moreover, conventional approaches generally only take into account a limited amount of information. Worse still, conventional approaches often rely on manual estimations and approximations, which can lead to inaccuracies and miscalculations. Accordingly, an improved approach for detecting, preventing, and reducing non-technical loss can be advantageous.

Various embodiments of the present disclosure are designed to account for all types of comprehensive information, such as information associated with energy providers, energy customers, utility meters, and other components of energy distribution or management systems. The information can be analyzed, such as by utilizing machine learning techniques, to determine properties or characteristics that are likely associated with non-technical loss. Instances of energy usage that have similar properties or characteristics can be classified as likely corresponding to non-technical loss. Such instances of energy usage can be identified and reported to help prevent or reduce further non-technical loss. It is further contemplated that many variations are possible.

FIG. 1 illustrates an example environment 100 for energy management, in accordance with an embodiment of the present disclosure. The environment 100 includes an energy management platform 102, external data sources 1041-*n*, an enterprise 106, and a network 108. The energy management platform 102, which is discussed in more detail herein, provides functionality to allow the enterprise 106 to track, analyze, and optimize energy usage of the enterprise 106. The energy management platform 102 may constitute an analytics platform. The analytics platform may handle data management, multi-layered analysis, and data visualization capabilities for all applications of the energy management platform 102. The analytics platform may be specifically designed to process and analyze significant volumes of frequently updated data while maintaining high performance levels.

The energy management platform 102 may communicate with the enterprise 106 through user interfaces (UIs) presented by the energy management platform 102 for the enterprise 106. The UIs may provide information to the enterprise 106 and receive information from the enterprise 106. The energy management platform 102 may communicate with the external data sources 1041-*n* through APIs and other communication interfaces. Communications involving the energy management platform 102, the external data sources 1041-*n*. and the enterprise 106 are discussed in more detail herein.

The energy management platform 102 may be implemented as a computer system, such as a server or series of servers and other hardware (e.g., applications servers, analytic computational servers, database servers, data integrator servers, network infrastructure (e.g., firewalls, routers, communication nodes)). The servers may be arranged as a server farm or cluster. Embodiments of the present disclosure may be implemented on the server side, on the client side, or a combination of both. For example, embodiments of the present disclosure may be implemented by one or more servers of the energy management platform 102. As another example, embodiments of the present disclosure may be implemented by a combination of servers of the energy management platform 102 and a computer system of the enterprise 106.

The external data sources 1041-*n* may represent a multitude of possible sources of data relevant to energy management analysis. The external data sources 1 041-*n* may include, for example, grid and utility operational systems, meter data management (MDM) systems, customer information systems (CIS), billing systems, utility customer systems, utility enterprise systems, utility energy conservation measures, and rebate databases. The external data sources 1041-*n* also may include, for example, building characteristic systems, weather data sources, third-party property management systems, and industry-standard benchmark databases.

The enterprise 106 may represent a user (e.g., customer) of the energy management platform 102. The enterprise 106 may include any private or public concern, such as large companies, small and medium businesses, households, individuals, governing bodies, government agencies, non-governmental organizations, nonprofits, etc. The enterprise 106 may include energy providers and suppliers (e.g., utilities), energy service companies (ESCOs), and energy consumers. The enterprise 106 may be associated with one or many facilities distributed over many geographic locations. The enterprise 106 may be associated with any purpose, industry, or other type of profile.

The network 108 may use standard communications technologies and protocols. Thus, the network 108 may include links using technologies such as Ethernet, 802.11, worldwide interoperability for microwave access (WiMAX), 3G, 4G, CDMA, GSM, LTE, digital subscriber line (DSL), etc. Similarly, the networking protocols used on the network 108 may include multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and the like. The data exchanged over the network 108 may be represented using technologies and/or formats including hypertext markup language (HTML) and extensible markup language (XML). In addition, all or some links may be encrypted using conventional encryption technologies such as secure sockets layer (SSL), transport layer security (TLS), and Internet Protocol security (IPsec).

In an embodiment, each of the energy management platform 102, the external data sources 1041-*n*, and the enterprise 106 may be implemented as a computer system. The computer system may include one or more machines, each of which may be implemented as machine 800 of FIG. 8, which is described in further detail herein.

Figure 2:
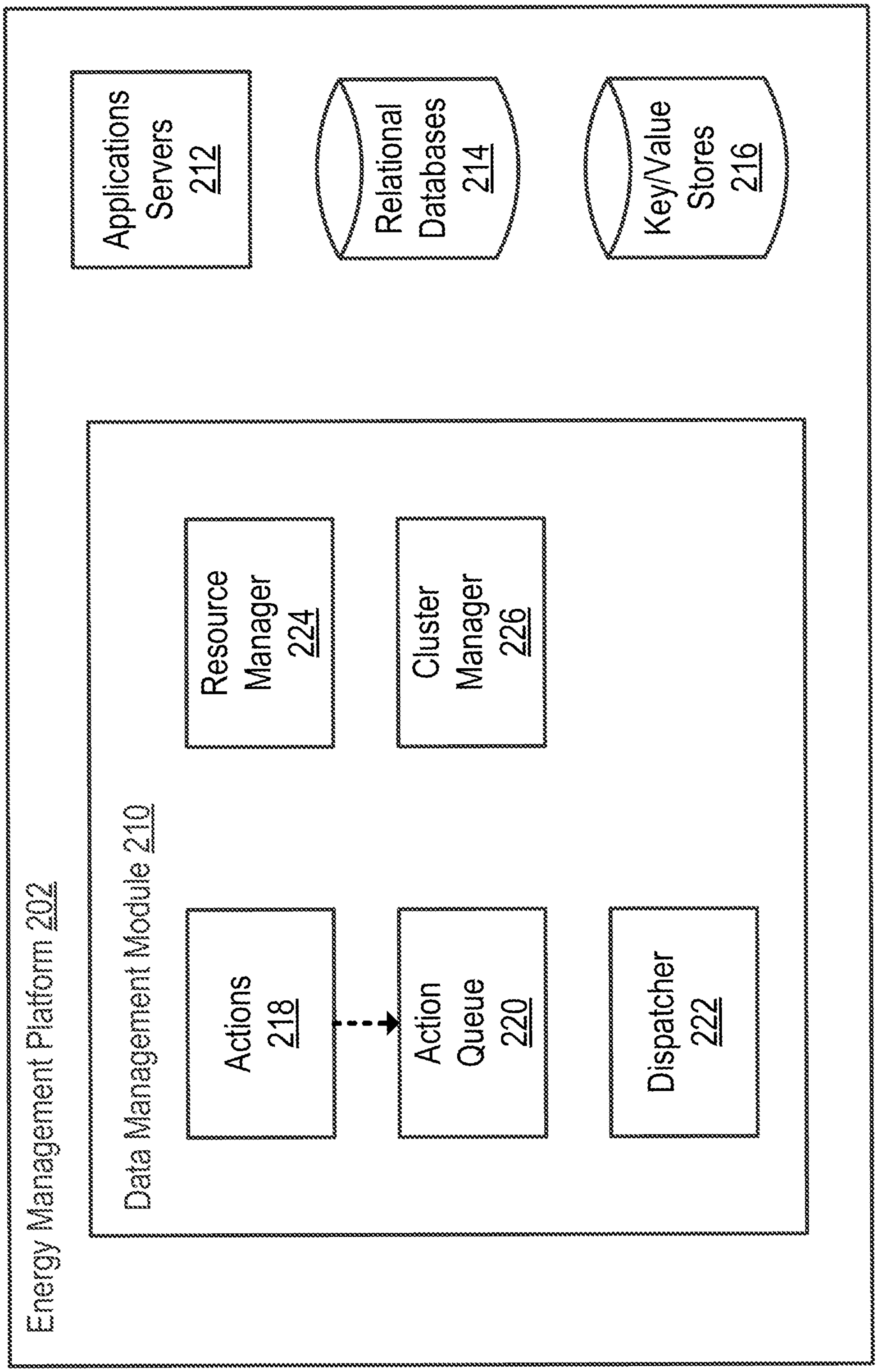
FIG. 2 illustrates an example energy management platform, in accordance with an embodiment of the present disclosure.

FIG. 2 illustrates an example energy management platform 202, in accordance with an embodiment of the present disclosure. In some embodiments, the example energy management platform 202 can be implemented as the energy management platform 102 of FIG. 1. In an embodiment, the energy management platform 202 may include a data management module 210, applications servers 212, relational databases 214, and key/value stores 216.

The data management module 210 may support the capability to automatically and dynamically scale a network of computing resources for the energy management platform 202 according to demand on the energy management platform 202. The dynamic scaling supported by the data management module 210 may include the capability to provision additional computing resources (or nodes) to accommodate increasing computing demand. Likewise, the data management module 210 may include the capability to release computing resources to accommodate decreasing computing demand. The data management module 210 may include one or more action(s) 218, a queue 220, a dispatcher 222, a resource manager 224, and a cluster manager 226.

The actions 218 may represent the tasks that are to be performed in response to requests that are provided to the energy management platform 202. Each of the actions 218 may represent a unit of work to be performed by the applications servers 212. The actions 218 may be associated with data types and bound to engines (or modules). The requests may relate to any task supported by the energy management platform 202. For example, the request may relate to, for example, analytic processing, loading energy-related data, retrieving an energy star reading, retrieving benchmark data, etc. The actions 218 are provided to the action queue 220.

The action queue 220 may receive each of the actions 218. The action queue 220 may be a distributed task queue and represents work that is to be routed to an appropriate computing resource and then performed.

The dispatcher 222 may associate and hand-off a queued action to an engine that will execute the action. The dispatcher 222 may control routing of each queued action to a particular one of the applications servers 212 based on load balancing and other optimization considerations. The dispatcher 222 may receive an instruction from the resource manager 224 to provision new nodes when the current computing resources are at or above a threshold capacity. The dispatcher 222 also may receive an instruction from the resource manager to release nodes when the current computing resources are at or below a threshold capacity. The dispatcher 222 accordingly may instruct the cluster manager 226 to dynamically provision new nodes or release existing nodes based on demand for computing resources. The nodes may be computing nodes or storage nodes in connection with the applications servers 212, the relational databases 214, and the key/value stores 216.

The resource manager 224 may monitor the action queue 220. The resource manager 224 also may monitor the current load on the applications servers 212 to determine the availability of resources to execute the queued actions. Based on the monitoring, the resource manager may communicate, through the dispatcher 222, with the cluster manager 226 to request dynamic allocation and de-allocation of nodes.

The cluster manager 226 may be a distributed entity that manages all of the nodes of the applications servers 212. The cluster manager 226 may dynamically provision new nodes or release existing nodes based on demand for computing resources. The cluster manager 226 may implement a group membership services protocol. The cluster manager 226 also may perform a task monitoring function. The task monitoring function may involve tracking resource usage, such as CPU utilization, the amount of data read/written, storage size, etc.

The applications servers 212 may perform processes that manage or host analytic server execution, data requests, etc. The engines provided by the energy management platform 202, such as the engines that perform data services, batch processing, stream services, may be hosted within the applications servers 212. The engines are discussed in more detail herein.

In an embodiment, the applications servers 212 may be part of a computer cluster of a plurality of loosely or tightly connected computers that are coordinated to work as a system in performing the services and applications of the energy management platform 202. The nodes (e.g., servers) of the cluster may be connected to each other through fast local area networks ("LAN"), with each node running its own instance of an operating system. The applications servers 212 may be implemented as a computer cluster to improve performance and availability over that of a single computer, while typically being more cost-effective than single computers of comparable speed or availability. The applications servers 212 may be software, hardware, or a combination of both.

The relational databases 214 may maintain various data supporting the energy management platform 202. In an embodiment, non-time series data may be stored in the relational databases 214, as discussed in more detail herein.

The key/value stores 216 may maintain various data supporting the energy management platform 202. In an embodiment, time series data (e.g., meter readings, meter events, etc.) may be stored in the key/value store, as discussed in more detail herein. In an embodiment, the key/value stores 216 may be implemented with Apache Cassandra, an open source distributed database management system designed to handle large amounts of data across a multitude of commodity servers. In an embodiment, other database management systems for key/value stores may be used.

In an embodiment, one or more of the applications servers 212, the relational databases 214, and the key/value stores 216 may be implemented by the entity that owns, maintains, or controls the energy management platform 202.

In an embodiment, one or more of the applications servers 212, the relational databases 214, and the key/value stores 216 may be implemented by a third party that may provide a computing environment for lease to the entity that owns, maintains, or controls the energy management platform 202. In an embodiment, the applications servers 212, the relational databases 214, and the key/value stores 216 implemented by the third party may communicate with the energy management platform 202 through a network, such as the network 208.

The computing environment provided by the third party for the entity that owns, maintains, or controls the energy management platform 202 may be a cloud computing platform that allows the entity that owns, maintains, or controls the energy management platform 202 to rent virtual computers on which to run its own computer applications. Such applications may include, for example, the applications performed by the applications server 200, as discussed in more detail herein. In an embodiment, the computing environment may allow a scalable deployment of applications by providing a web service through which the entity that owns, maintains, or controls the energy management platform 202 can boot a virtual appliance used to create a virtual machine containing any software desired. In an embodiment, the entity that owns, maintains, or controls the energy management platform 202 may create, launch, and terminate server instances as needed, paying based on time usage time, data usage, or any combination of these or other factors. The ability to provision and release computing resources in this manner supports the ability of the energy management platform 202 to dynamically scale according to the demand on the energy management platform 202.

Figure 3:
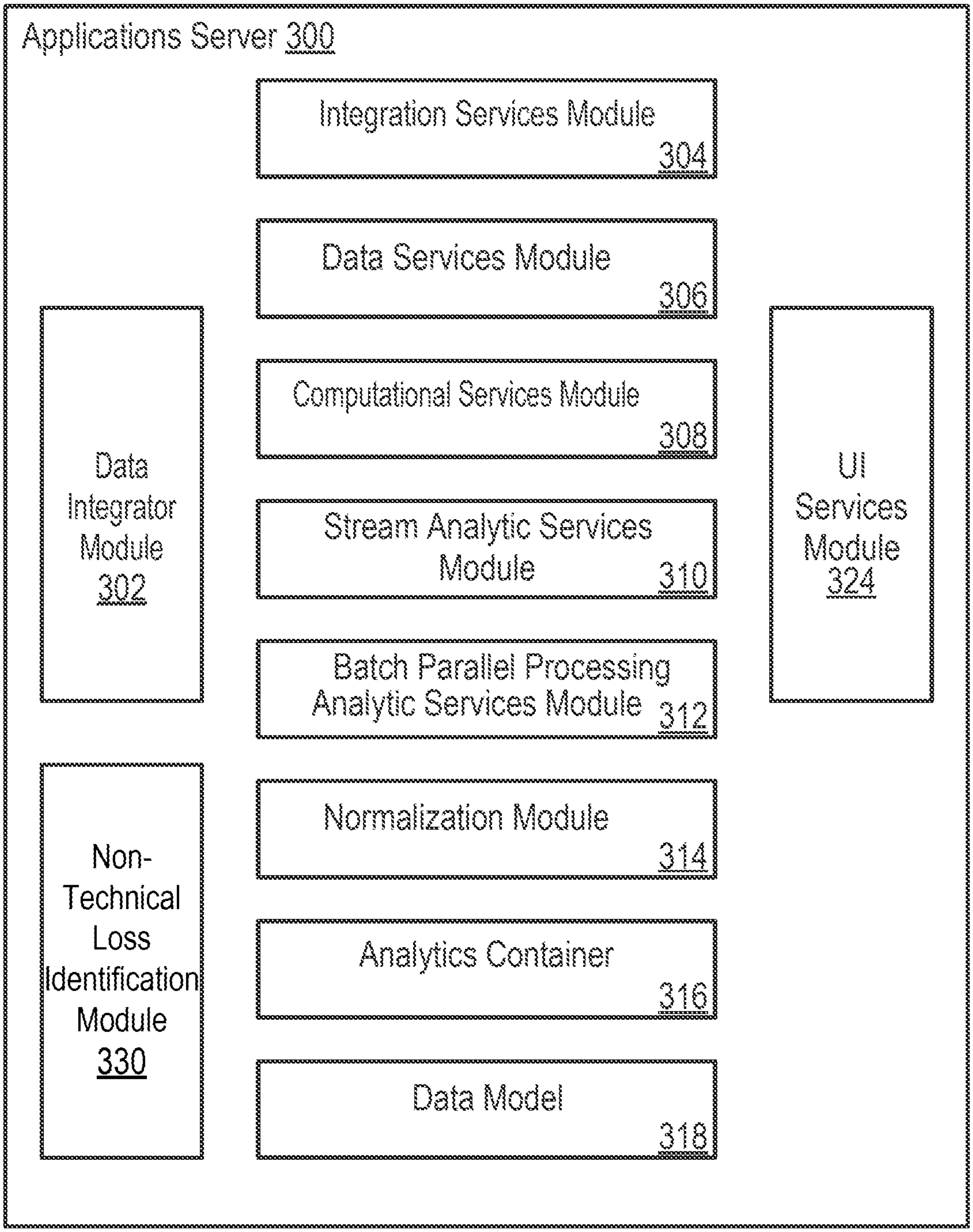
FIG. 3 illustrates an example applications server of an energy management platform, in accordance with an embodiment of the present disclosure.

FIG. 3 illustrates an example applications server 300 of an energy management platform, in accordance with an embodiment of the present disclosure. In an embodiment, one or more of the applications servers 212 of FIG. 2 may be implemented with applications server 300 of FIG. 3. The applications server 300 includes a data integrator (data loading) module 302, an integration services module 304, a data services module 306, a computational services module 308, a stream analytic services module 310, a batch parallel processing analytic services module 312, a normalization module 314, an analytics container 316, a data model 318, and a user interface (UI) services module 324. In some embodiments, the applications server 300 can also include an non-technical loss (NTL) identification module 330.

The analytics platform supported by the applications server 300 includes multiple services that each handles a specific data management or analysis capability. The services include the data integrator module 302, the integration services module 304, the data services module 306, the computational services module 308, the stream analytic services module 310, batch parallel processing analytic services module 312, and the UI services module 324. All or some services within the analytics platform may be modular and accordingly architected specifically to execute their respective capabilities for large data volumes and at high speed. The services may be optimized in software for high performance distributed computing over a computer cluster including the applications servers 212.

The modules and components of the applications server 300 in FIG. 3 and all the figures herein are merely exemplary, and may be variously combined into fewer modules and components, or separated into additional modules and components. The described functionality of the modules and components may be performed by other modules and components.

The data integrator module 302 is a tool for automatically importing data maintained in software systems or databases of the external data sources 1041-*n* into the energy management platform 102 of FIG. 1. The imported data may be used for various applications of the energy management platform 102 or the application server 300. The data integrator module 302 accepts data from a broad range of data sources, including grid and operational systems such as MDM, CIS, and billing systems, as well as third-party data sources such as weather databases, building databases (e.g., Urban Planning Council database), third-party property management systems, and external benchmark databases. The imported data may include, for example, meter data (e.g., electricity consumption, water consumption, natural gas consumption) provided at minimum daily or other time intervals (e.g., 15-minute intervals), weather data (e.g., temperature, humidity at daily or other time intervals (e.g., hourly intervals), building data (e.g., square footage, occupancy, age, building type, number of floors, air conditioned square footage), aggregation definitions (hierarchy) (e.g., meters to building, buildings to city block, building's regional identification), and asset data (e.g., number and type of HVAC assets, number and type of production units (for plants)).

The data integrator module 302 also has the ability to import information from flat files, such as Excel spreadsheets, and has the ability to capture information entered directly into an application of the energy management platform 102. By incorporating data from a broad array of sources, the application server 300 is capable of performing complex and detailed analyses, enabling greater business insights.

The data integrator module 302 provides a set of standardized canonical object definitions (standardized interface definitions) that can be used to load data into applications of the application server 300. The canonical objects of the data integrator module 302 may be based on current or emerging utility industry standards, such as the Common Information Model (CIM), Green Button, and Open Automatic Data Exchange, or on the specifications of the application server 300. The application server 300 may support these and other standards to ensure that a broad range of utility data sources will be able to connect easily to the energy management platform 102. Canonical objects may include, for example:

| CANONICAL OBJECT | DEFINITION AND DESCRIPTION |
| --- | --- |
| Organization | An individual entity or sub entity involved in the consumption of energy. Example data source: Customer Information System (CIS). Associated data includes: name, organizational hierarchy, organizational identification number, primary contact, contact information. |
| Facility | A facility such as an office, data center, hospital, etc. A facility is placed at a location and is owned or leased by an organization. Example data sources: CIS, billing system, data warehouse. Associated data includes: facility name, mailing address, ownership, facility identification number, service address, building characteristics such as floor area, longitude/latitude, date of construction. |
| Service | Agreements an organization has with a utility. Example data sources: billing system, data warehouse. Associated data includes: service account number, billing account number, bill-to accounts, types of services provided (electricity, natural gas, water), associated meters and facilities. |
| Billing | Vendor data as presented on utility bills. Example data source: billing system. Associated data includes: start date, end date, billed consumption, billed demand, peak demand, reactive demand, taxes and fees, bill number. |
| UsagePoint | The resource-consuming entity for which interval data is provided. Example data sources: meter data management system (MDM). Associated data includes: asset associated with meter, type of of resource measured (electricity, natural gas), measurement methodology, unit of measure. |
| MeterReading | A unique type of measurement—for example, power (kW), consumption (kWh), voltage, temperature, etc. A MeterReading contains both measurement values and timestamps Example data sources: MDM. Associated data includes: resource consumption data, resource demand data, time period. |
| Energy Conservation Measure | An action undertaken to reduce the energy consumption and spend. Example data sources: data warehouse, spreadsheets. Associated data includes: project name, project type, estimated cost, estimated resource savings, estimated financial savings simple payback, return on investment, measure lifetime, facility. |
| External Benchmark | Industry standard benchmark data. External Benchmarks can apply for a whole facility or can apply to an end-use category. Example data sources: third party databases. Associated data includes: facility type, building size, climate region, building vintage, end use, end use energy intensity, whole building energy intensity, energy cost intensity, whole building energy cost intensity. |
| Region | User-defined geographic area where an organization does business. Hierarchy of subsections that allows the creation of aggregated analyses. Data source: CIS, data warehouse. Associated data includes: region definitions, parent/child relationship definitions. |

Once the data in canonical form is received, the data integrator module 302 may transform the data into individual data entities in accordance with the data model 318 so that the data can be loaded into a database schema to be stored, processed, and analyzed.

The data integrator module 302 is capable of handling very high volumes of data (e.g., "big data"). For example, the data integrator module 302 may frequently process interval data from millions of digital meters. To receive data, the application server 300 may provide a consistent secured web service API (e.g., REST). Integration can be carried out in an asynchronous batch or real-time mode. The data integrator module 302 may incorporate real-time and batch data from, for example, utility customer systems, building characteristic systems, industry-standard benchmark systems, utility energy conservation measures and rebate databases, utility enterprise systems, MDM, and utility operational systems. When an external data source does not possess an API or computerized means by which to extract data, the application server 300 can pull data directly from a web page associated with the external data source (e.g., by using web scraping).

The data integrator module 302 also may perform initial data validation. The data integrator module 302 may examine the structure of the incoming data to ensure that required fields are present and that the data is of the right data type. For example, the data integrator module 302 may recognize when the format of the provided data does not match the expected format (e.g., a number value is erroneously provided as text), prevents the mismatched data from being loaded, and logs the issue for review and investigation. In this way, the data integrator module 302 may serve as a first line of defense in ensuring that incoming data meets the requirements for accurate analysis.

The integration services module 304 serves as a second layer of data validation or proofing, ensuring that data is error-free before it is loaded into a database or store. The integration services module 304 receives data from the data integrator module 302, monitors the data as it flows in, performs a second round of data checks, and passes data to the data services module 306 to be stored.

The integration services module 304 may provide various data management functions. The integration services module 304 may perform duplicate handling. The integration services module 304 may identify instances of data duplication to ensure that analysis is accurately conducted on a singular data set. The integration services module 304 can be configured to process duplicates according to business requirements specified by a user (e.g., treating two duplicate records as the same or averaging duplicate records). This flexibility allows the application server 300 to conform to customer standards for data handling.

The integration services module 304 may perform data validation. The integration services module 304 can detect data gaps and data anomalies (e.g., statistical anomalies), identify outliers, and conduct referential integrity checks. Referential integrity checking ensures that data has the correct network of associations to enable analysis and aggregation, such as ensuring that loaded meter data is associated with a facility or, conversely, that facilities have associated meters. The integration services module 304 resolves data validation issues according to the business requirements specified by a user. For example, if there are data gaps, linear interpolation can be used to fill in missing data or gaps can be left as is.

The integration services module 304 may perform data monitoring. The integration services module 304 can provide end-to-end visibility throughout the entire data loading process. Users can monitor a data integration process as it progresses from duplicate detection through to data storage. Such monitoring helps to ensure that data is loaded properly and is free of duplication and validation errors.

The data services module 306 is responsible for persisting (storing) large and increasing volumes of data, while also making data readily available for analytical calculations. The data services module 306 partitions data into relational and non-relational (key/value store) databases and also performs operations on stored data. These operations include creating, reading, updating, and deleting data. A data engine of the data services module 306 may persist data for stream processing. The data engine of the data services module 306 also may identify a data set to be processed in connection with a batch job for batch parallel processing.

The data services module 306 may perform data partitioning. The data services module 306 takes advantage of relational and non-relational data stores, such as the relational database 214 and the key/value store 216 of FIG. 2. By "partitioning" the data into two separate data stores, the relational database 214 and the key/value store 216, the application server 300 ensures that its applications can efficiently process and analyze the large volumes of data, such as interval data originating from meters and grid sensors. The data in the relational database 214 and the key/value store 216 is stored in accordance with the data model 318 of the energy management platform 102.

The relational database 214 is designed to manage structured and slow-changing data. Examples of such data include organization (e.g., customer) and facility data. Relational databases, like the relational database 214, are designed for random access updates.

The key/value store 216 is designed to manage very large volumes of interval (time-series) data, such as meter and grid sensor data. Key/value stores, like the key/value store 216, are designed for large streams of "append only" data that are read in a particular order. "Append only" refers to new data that is simply added to the end of an associated file. By using the dedicated key/value store 216 for interval data, the application server 300 ensures that this type of data is stored efficiently and can be accessed quickly.

The data services module 306 may perform distributed data management. The data services module 306 may include an event queue that schedules provision of notifications to perform stream processing and batch parallel processing. With respect to batch parallel processing, the scheduling may be based on rules that account for the availability of processing resources in an associated cluster in the energy management platform 102. As data volumes grow, the data services module 306 automatically adds nodes to the cluster to accommodate (e.g., store and process) the new data. As nodes are added, the data services module 306 automatically rebalances and partitions the data across all nodes, ensuring continued high performance and reliability.

The computational services module 308 is a library of analytical functions that are invoked by the stream analytic services module 310 and the batch parallel processing analytic services module 312 to perform business analyses. The functions can be executed individually or combined to form complex analyses. The services provided by the computational services module 308 may be modular (i.e., dedicated to a single task) so that the computational services module 308 can parallel process a large number of computations simultaneously and quickly, which allows for significant computational scalability.

The computational services module 308 also may leverage distributed processing to create even greater scalability. For example, if a user is interested in calculating the average annual electricity use for hundreds of thousands of meters, the energy management platform 102 is capable of rapidly responding by distributing the request across multiple servers.

The stream analytic services module 310 performs sophisticated analyses on real-time and near-real-time streams of data. A stream may represent, for example, a feed of high volume data from a meter, sub-meter, or grid sensor. In an embodiment, the stream may be a Supervisory Control and Data Acquisition (SCADA) feed of data. The stream analytic services module 310 may be invoked to analyze this data when the analysis needs to be conducted soon after the data is generated.

The stream analytic services module 310 may include a stream processor to convert the stream into data that is in accordance with the data model 318. The stream analytic services module 310 also may include stream processing logic, which can be provided by a user of the energy management platform 102. The stream processing logic may provide a calculated result that can be persisted and used for subsequent analysis. The stream processing logic also may provide an alert based on a calculated result. For example, a utility may want to receive alerts and on-the-fly analysis when there is an unexpected and significant drop or spike in load. This load variation could be caused by a malfunctioning piece of equipment or sudden damage to equipment, and could possibly represent great risk to the distribution system or an end customer. Data about the unexpected load change can be rapidly recognized, analyzed, and used to send the necessary alert. The stream processing logic also may provide, after processing the original stream, a new stream based on the processed original stream for another purpose or application of the energy management platform 102.

The stream analytic services module 310 may perform near real-time, continuous processing. Because processing by the stream analytic services module 310 occurs very quickly after the data arrives, time-sensitive, high priority analyses provided by the energy management platform 102 are relevant and actionable.

The stream analytic services module 310 may provide horizontal scalability. In order to manage large volumes of data simultaneously, processing by the stream analytic services module 310 can be distributed throughout a server cluster, a set of computers working together.

The stream analytic services module 310 may provide fault tolerance. Streams may be persisted. If a processing failure occurs on one node (e.g., a computer in a cluster), the workload will be distributed to other nodes within the cluster with no loss of data. A stream may be discarded after the processing performed on the stream is completed.

A non-limiting example is provided to illustrate performance of the stream analytic services module 310. Assume streams of recently generated electricity consumption and demand data. The streams may be provided to an event queue associated with the data services module 306. When the data arrives into the event queue, automatic analytic processes are triggered. Multiple analytic processes, or analyses, can be run upon the same data set. The analytic processes may be performed in parallel. Parallel processing on the same data set enables faster processing of multiple analyses. The outputs of these analytic processes may be alerts and calculations that are then stored in a database and made available to designated end users as analysis results. The analytic processes and processing tasks may be distributed across multiple servers that support the stream analytic services module 310. In this way, large data volumes can be rapidly processed by the stream analytic services module 310.

The batch parallel processing analytic services module 312 may perform a substantial portion of analysis required by users of the energy management platform 102. The batch parallel processing analytic services module 312 may analyze large data sets comprised of current and historical data to create reports and analyses, such as periodic Key Performance Indicator (KPI) reporting, historical electricity use analysis, forecasts, outlier analysis, energy efficiency project financial impact analysis, etc. In an embodiment, the batch parallel processing analytic services module 312 may be based on MapReduce, a programming model for processing large data sets and distributing computations on one or more clusters of computers. The batch parallel processing analytic services module 312 automatically performs the tasks of parallelization, fault-tolerance, and load balancing, thereby improving the performance and reliability of processing-intensive tasks.

A non-limiting example is provided to illustrate performance of the batch parallel processing analytic services module 312. As examples, a benchmark analysis of energy intensity, a summary of performance against key performance indicators, and an analysis of unbilled energy due to non-technical loss could be jobs handled by the batch parallel processing analytic services module 312. When a batch processing job is invoked in the energy management platform 102, an input reader associated with the batch parallel processing analytic services module 312 breaks down the processing job into multiple smaller batches. This breakdown reduces the complexity and processing time of the job. Each batch is then handed to a worker process to perform its assigned task (e.g., a calculation or evaluation). The results are then "shuffled," which refers to rearrangement of the data set so that the next set of worker processes can efficiently complete the calculation (or evaluation) and quickly write results to a database through an output writer.

The batch parallel processing analytic services module 312 can distribute worker processes across multiple servers. Such distributed processing is employed to fully utilize the computational power of the cluster and to ensure that calculations are completed quickly and efficiently. In this way, the batch parallel processing analytic services module 312 provides scalability and high performance.

The normalization module 314 may normalize meter data that is to be maintained in the key/value store 216. For example, normalization of meter data may involve filling in gaps in the data and addressing outliers in the data. For example, if meter data is expected at consistent intervals but data actually provided to the energy management platform 102 does not have meter data at certain intervals, the normalization module 314 may apply certain algorithms (e.g., interpolation) to provide the missing data. As another example, aberrational values of energy usage can be detected and addressed by the normalization module 314. In an embodiment, normalization performed by the normalization module 314 may be configurable. For example, the algorithms (e.g., linear, non-linear) used by the normalization module 314 may be specified by an administrator or a user of the energy management platform 102. Normalized data may be provided to the key/value store 216.

The UI services module 324 provides the graphical framework for all applications of the energy management platform 102. The UI services module provides visualization of analytical results so that end users may receive insights that are clear and actionable. After analyses are completed by the stream analytic services module 310 or the batch parallel processing analytic services module 312, they may be graphically rendered by the UI services module 324, provided to the appropriate application of the energy management platform 102, and ultimately presented on a computer system (e.g., machine) of the user. This delivers data insights to users in an intuitive and easy-to-understand format.

The UI services module 324 provides many features. The UI services module 324 may provide a library of chart types and a library of page layouts. All variations in chart types and page layouts are maintained by the UI services module 324. The UI services module 324 also may provide page layout customization. Users, such as administrators, can add, rename, and group fields. For example, the energy management platform 102 allows a utility administrator to group energy intensity, energy consumption, and energy demand together on a page for easier viewing. The UI services module 324 may provide role-based access controls. Administrators can determine which parts of the application will be visible to certain types of users. Using these features, the UI services module 324 ensures that end users enjoy a consistent visual experience, have access to capabilities and data relevant to their roles, and can interact with charts and reports delivering clear business insights.

Moreover, in some implementations, the application server 300 includes the non-technical loss (NTL) identification module 330, as shown in FIG. 3. The non-technical loss identification module 330 can be configured to facilitate utilizing machine learning to identify non-technical loss. In some embodiments, the non-technical loss identification module 330 can be implemented as hardware, software, and/or a combination thereof. It is also contemplated that, in some instances, one or more portions or components of the non-technical loss identification module 330 can be implemented with one or more other modules, engines, and/or components of the energy management platform 102 of FIG. 1.

In one example, the non-technical loss identification module 330 can be configured to acquire or determine signal values for a set of signals indicative of the existence of non-technical loss (e.g., NTL). The set of signals indicative of the existence of non-technical loss can directly or indirectly reflect various conditions of energy usage. Such energy usage conditions may relate to, for example, types of energy usage, states of energy usage, amounts of energy usage, readings of energy usage from meters, operating status of meters, states of customer accounts with energy providers, and any other considerations that directly or indirectly reflect energy provision, usage, availability, and payments. Each signal from the set of signals can reflect a particular energy usage condition. A signal value for a signal from the set of signals may be a numerical, boolean, binary, or qualitative value that describes the magnitude, type, or existence (or nonexistence) of the energy usage condition associated with the signal. For example, energy usage conditions can refer to various instances during which energy is being used or consumed, including instances of zero consumption or non-use. In some cases, an energy usage condition can be representative of a state (e.g., a current state) of energy usage as measured by an energy or utility meter (e.g., gas meter, electricity meter, water meter, etc.). In some cases, a particular energy usage condition can be associated with usage of a particular type of energy by a particular energy consumer or customer at a particular geolocation in a particular venue at a particular time or interval. As such, energy usage conditions can be associated not only with meters that measure the usage, but also associated with customer information, locational information, venue types, dates and times, etc.

The set of signals can correspond to a selected set of analytics or features generated based on acquired data, such as data received from the external data sources 1041-*n* of FIG. 1. In some embodiments, the set of signals can be selected, chosen, or determined based on research, development, observation, machine learning, and/or experimentation, etc. For example, based on empirical analysis, it can be determined that certain signals are more useful for indicating non-technical loss (NTL), and these signals therefore are selected or prioritized over other signals that cannot or are less likely to indicate non-technical loss. The data received from data sources can include, but is not limited to, AMI systems data (meter data management and head end data), customer information data, customer consumption data, billing information, contract information, meter event information, outage management system (OMS) data, producer generation, workorder management (WOM) data, verified theft and malfunction data, weather, and geographic localization. The data sources can include, but are not limited to, grid and utility operational systems, meter data management (MDM) systems, customer information systems (CIS), billing systems, utility customer systems, utility enterprise systems, utility energy conservation measures, rebate databases, building characteristic systems, weather data sources, third-party property management systems, industry-standard benchmark databases, etc.

With a large quantity of various signals in a multitude of signal categories and respective signal values of these signals, a better understanding of energy usage can be achieved. Each signal from a category of various signal categories can be generated and its respective signal value calculated based on at least a portion of the acquired data. In some cases, there can be tens of signal categories and, within each signal category, hundreds of signals or more. The present disclosure will only discuss a few examples. It is understood that many signal categories and signals thereof other than those expressly discussed herein can be utilized as well. In some implementations, signal values can be numerical values, values between 0 and 1, binary values, etc.

An example signal category is an “Account Attribute” signal category. The “Account Signal” category can include a variety of signals. For example, a first signal of the “Account Signal” category can be referred to as a “Seasonal Meter” signal. The “Seasonal Meter” signal can indicate whether a premise (or customer) is recorded as being seasonal, such as for a vacation home. Data from the CIS, such as customer information and customer consumption data, can indicate that the premise is seasonal and a signal value can be set for the “Seasonal Meter” signal to represent that the premise is seasonal.

As another example, a second signal of the “Account Attribute” signal category can be referred to as a “Service Disconnected” signal. The “Service Disconnected” signal can indicate whether a premise has a service point that has been terminated or disconnected at a relevant time of analysis (e.g., time of data acquisition). If the service point has been disconnected, then a signal value for the “Service Disconnected” signal would indicate that the service point has been disconnected. If the service point has not been disconnected, then the signal value would indicate that the service point has not been disconnected.

A further example signal category is an “Anomalous Load” signal category. The “Anomalous Load” signal category can include an “Active Power vs. Reactive Power Curve Analysis" signal, which relates to analyzing active and reactive power data and identifying anomalous patterns that are indicative of theft and/or malfunction. For example, signal values for the "Active Power vs. Reactive Power Curve Analysis" signal can characterize irregular variations in year-over-year consumption patterns for a given customer, which can indicate a likelihood of theft and/or malfunction. The "Anomalous Load" signal category can also include a "Count of Days with Year-over-Year Consumption Drop" signal, which relates to recording a number of days with year-over-year decreasing usage. In addition, the "Anomalous Load" signal category can include a "Year-over-Year Variation (Quarter Hourly)" signal, which relates to computing a maximum difference in consumption during one month from one year to the previous year. Moreover, the "Anomalous Load" signal category can include a "Consumption Drop" signal relating to tracking a consumption profile and recording when a 15-day rolling average consumption for a meter drops by more than 20%.

A further example signal category is a "Calculated Status" signal category, which can include signals that facilitate cross-checking a status of a meter such as by checking whether the meter status is set to active or whether the meter is reporting communication issues. A "Meter Location Indoor" signal in this category can indicate that a meter is indoors. A "Meter Location Outdoor" signal in this category can indicate that a meter is outdoors. A "Consumption on Service Inactive (Electric)" signal in this category can indicate that service is not active, but there is nonetheless electrical consumption on a meter.

A further example signal category is a "Consumption on Inactive" signal category. The "Consumption on Inactive" signal category can include a "Consumption on Inactive" signal, which relates to detecting customers with non-zero consumption who have service accounts that are disconnected by the utility company. The "Consumption on Inactive" signal category can also include a "Consumption on Inactive (Gas)" signal, which relates to a situation in which no service agreement is active, but that there is gas consumption on the meter.

A further example signal category is a "Current Analysis" signal category. Signals in this category can be associated with analyzing historical current (amperage) profiles to assess any inconsistencies in load harmonics, actual power versus reactive power measures, and potential interruptions. This category can include a "CT>0.5 amps" signal indicating intervals in which the current transformer (CT) is greater than 0.5 amps, and a "CT<0.05 amps" signal indicating intervals in which the Current Transformer (CT) is less than 0.05 amps.

A further example signal category is a "Missing Data" signal category, which includes signals that relate to missing data. A "Missing Data" signal in this signal category relates to identifying if a meter is missing consumption data.

A further example signal category is a "Disconnected" signal category, which includes signals that are associated with assessing whether a meter has been disconnected from the communication network. An "Electric Disconnected Unreachable" signal in this category can indicate a number of days since a remotely disconnected Advanced Metering Infrastructure (AMI) meter became unreachable. A "Communication after Hard Disconnect" signal in this category can indicate that Network Interface Controller (NIC) Power Restore events were detected after a service point was disconnected at a pole or a service head. A "Days Disconnected Before Unreachable" signal in this category can indicate a number of days a meter was disconnected before becoming unreachable.

A further example signal category is a "Meter Events" signal category, which includes signals that track various meter events (e.g., meter tamper event, meter malfunction event, meter last gasp event, etc.) and that filter any noise (e.g., due to a large volume of meter events reported by meters, many of which are false-positives). A "Malfunction Event" signal in this category can identify a meter with a malfunction event and can count how many times malfunction events have been triggered. A "Malfunction and Off Event Count" signal in this category can identify a meter with a malfunction event and can count how many readings of malfunction and off events. A "Tamper Event Count" signal in this category can assess the number of recorded meter tamper events. A "Tamper Combined with Malfunction Combined with Off Meter Events" in this signal category can identify a meter having combined meter events including a tamper event, a malfunction event, and an off event.

A further example signal category is a "Monthly Meter" signal category, which includes signals that are associated with meters reporting data at monthly intervals. These signals can provide insight into monthly reporting meters or, more generally, can facilitate predicting patterns with less available data. A "Maximum Monthly Consumption Drop" signal in this signal category can record a maximum month-over-month consumption drop. A "Year-over-Year Variation (Monthly, Seasonal)" signal in this category can compute a maximum difference in consumption during one month from one year to the previous year for non-seasonal meters. A "Consumption on Inactive Meter (Monthly)" signal can identify that a meter contract has ended and non-zero (monthly) consumption was recorded after the contract termination date.

A further example signal category is an "Outage" signal category, which includes signals that can track outages, interruptions, and can correlate with a consumption profile to provide more insight about whether a meter was tampered with or if the meter experienced outage. A "Line Outage Event" signal in this category can identify whether a line outage event was recorded for a meter. An "Outage Correlated with Consumption Drop" signal in this category can track outage data and set a flag when there is an outage that is correlated with a decline in a consumption profile. A "Partial Line Outage Event" signal in this category can track whether a partial line outage event was detected.

A further example signal category is a "Stolen Meter" signal category. A "Is Outage And Stolen Meter" signal in this category relates to whether the meter was stolen and whether it happened within a short outage. A "Stolen Meter Distance" signal in this category relates to whether a meter is >300 feet from the expected installation location.

A further example signal category is an "Unusual Production" signal category, which includes signals that can track net-metering customers who produce electricity (e.g., solar electricity) and can detect that the production data is anomalous. A "Production After Dark" signal in this category can identify whether production (reverse-consumption) during dark hours is detected. An "Electricity Production After Dark" signal in this category can indicate that electricity is being produced during dark hours.

A further example signal category is a "Work Order" signal category, which includes signals that track work orders to derive insight about whether a customer has been reported stealing, or has had a history of non-payment on his or her account, etc. Signals in the "Work Order" category can be powerful in drawing insights in correlation with consumption patterns and modes of theft. A "Cancellation of Work Order" signal in this category can identify a cancellation of service for a customer who has missed payments. A "Change of Contract" signal in this category can Identify whether a service change of contract has been registered. A "Change of Meter" signal in this category can generate a result for each work order that corresponds to a change of meter.

A further example signal category is a "Zero Reads" signal category, which includes signals that track the zero reads on a meter to detect patterns of zero consumption that do not match nearest neighbors or a cluster of peer accounts. A "Intermittent Zero Reading" signal in this category can identify meter zero readings sustained for a specified number of sequential meter readings (e.g., within a specified period of time). A "Sustained Zero Readings Correlated with Outage (Non-Seasonal)" signal in this category can track sustained zero readings (e.g., beyond 7 days) correlated with outage (non-seasonal) meters. An "Intermittent Zero" signal in this category can indicate zero read periods that last a specified time period (e.g., at least 6 hours).

Again, the signals and signal categories described herein are examples and are for illustrative purposes. Other suitable signals and signal categories may be additionally or alternatively employed. It is further contemplated that numerous variations are possible. In some cases, there can be a greater (or lesser) number of signals than those described herein. In some embodiments, a first signal in the set of signals can be generated based on a modification to a second signal in the set of signals. In one example, the first signal can be generated based on a permutation of the second signal. In another example, the first signal can be generated based on a combination of the second signal and a third signal.

In some instances, there can be a greater (or lesser) number of signal categories than those described herein. For example, in some embodiments, one or more signals in the set of signals can be associated with at least one of an account attribute signal category, an anomalous load signal category, a calculated status signal category, a consumption on inactive signal category, a current analysis signal category, a missing data signal category, a disconnected signal category, a meter event signal category, a monthly meter anomalous load signal category, a monthly meter consumption on inactive signal category, an outage signal category, a stolen meter signal category, an unusual production signal category, a work order signal category, or a zero reads signal category.

After determination of a set of selected signals from selected signal categories, signal values for the signals can be determined based on the data received from the data sources. In some implementations, determining the signal values can include determining a set of formulas for the set of signals. Each formula in the set of formulas can correspond to a respective signal in the set of signals. Then the signal values for the set of signals can be calculated based on the set of formulas. By way of illustration, a signal value for a "Consumption Drop" signal can correspond to a numerical consumption drop amount of a meter compared to the average consumption of the meter. It is appreciated that numerous other formulas can be acquired or developed for various other signals. Furthermore, in some implementations, signal values can be normalized across the set of signals.

After determination of signal values for the set of signals, the non-technical loss identification module 330 can generate, based on the signal values, a plurality of N-dimensional representations (e.g., points in N-dimensional space) for the plurality of energy usage conditions, where N represents the number of signals (i.e., signal quantity) in a set of signals indicative of the presence of non-technical loss. For example, if there are 150 signals, then the N-dimensional representation can have 150 dimensions. Each dimension can correspond to a respective signal. A particular energy usage condition in the plurality of energy usage conditions can be represented as a point in N-dimensional space with coordinates based on the signal values.

The non-technical loss identification module 330 can further apply at least one machine learning algorithm to the plurality of N-dimensional representations to produce a classifier model for identifying non-technical loss. The classifier model can be utilized for identifying energy usage conditions that likely involve non-technical loss, such as in the form of theft or malfunction.

Figure 4:
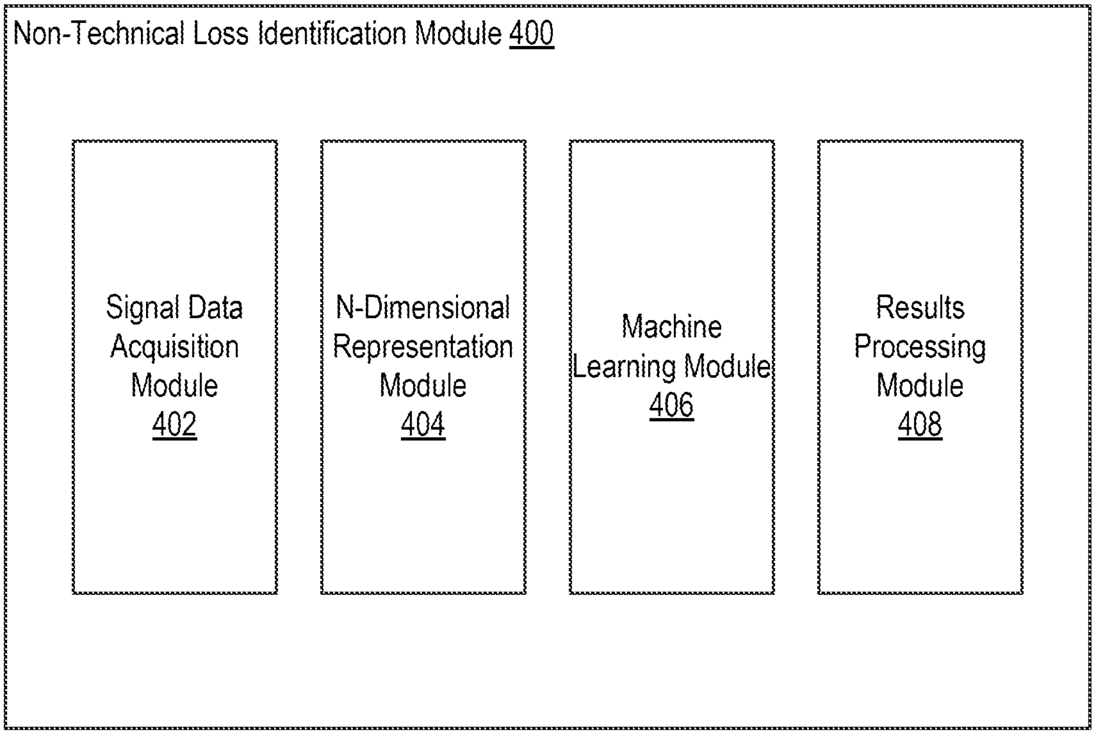
FIG. 4 illustrates an example non-technical loss (NTL) identification module configured to utilize machine learning to identify non-technical loss, in accordance with an embodiment of the present disclosure.

FIG. 4 illustrates an example non-technical loss (NTL) identification module 400 configured to utilize machine learning to identify non-technical loss, in accordance with an embodiment of the present disclosure. The example non-technical loss identification module 400 can be implemented as the non-technical loss identification module 330 of FIG. 3. As discussed above, in some embodiments, various portions of the non-technical loss identification module 400 can be implemented as one or more components of the energy management platform 202 of FIG. 2. For example, in some embodiments, at least some portions of the non-technical loss identification module 400 can be implemented as one or more components of the applications server 300 of FIG. 3.

As shown in FIG. 4, the non-technical loss identification module 400 can include a signal data acquisition module 402, an N-dimensional representation module 404, a machine learning module 406, and a results processing module 408. The signal data acquisition module 402 can be configured to determine a set of signals and associated signal values for the set of signals. The signal values can be associated with a plurality of energy usage conditions. In some embodiments, the signal data acquisition module 402 can be implemented as, reside within, and/or operate in conjunction with the data integrator module 302 of FIG. 3. Data from the external data sources 1041-*n* can be received and the set of signals can be generated based on such received data. The signal data acquisition module 402 can determine signal values for the set of signals, such as by applying a set of formulas for the set of signals. Each formula in the set of formulas can correspond to a respective signal in the set of signals. In some cases, the set of formulas can be derived or developed from research, analysis, observation, experimentation, etc. The signal data acquisition module 402 can be configured to calculate signal values for the set of signals based on the set of formulas. In some cases, each condition of energy usage can be represented by one or more respective signal values. For example, a specific set of signal values can be associated with a current state of a specific utility meter for a specific customer at a specific location and venue.

The N-dimensional representation module 404 can be configured to generate a plurality of N-dimensional representations for the plurality of energy usage conditions. The plurality of N-dimensional representations can be generated based on the signal values. Each N-dimensional representation can be generated based on signal values associated with a respective condition of energy usage. Each N-dimensional representation can have N-dimensions corresponding to a signal quantity of the set of signals. In one example, each energy usage condition can be represented as a point in N-dimensional space and can have coordinates corresponding to its respective signal values. In another example, each energy usage condition can be represented as an N-dimensional vector with vector values corresponding to its respective signal values. Other N-dimensional representation can also be utilized.

The machine learning module 406 can be configured to apply at least one machine learning algorithm to the plurality of N-dimensional representations. A classifier model for identifying non-technical loss can be produced, developed, or generated based on application of the at least one machine learning algorithm to the plurality of N-dimensional representations.

In some embodiments, the at least one machine learning algorithm can be associated with a supervised process. In one example, at least a first portion of the plurality of N-dimensional representations can have been previously recognized or verified as corresponding to non-technical loss. At least a second portion of the plurality of N-dimensional representations can have been previously recognized or verified as corresponding to normal energy usage. The machine learning module 406 can classify new signal values associated with new energy usage conditions as being normal or as being associated with NTL based on their proximity to N-dimensional representations that have been verified as being normal or as being associated with NTL. The machine learning module 406 can be configured to determine one or more N-dimensional representations that are near or clustered with the first portion. The machine learning module 406 can classify these one or more N-dimensional representations near or clustered with the first portion as corresponding to non-technical loss because they have properties (e.g., signal values) that are similar to those of the first portion. In some cases, a first representation is near (or clustered with, close to, etc.) a second representation when they are within an allowable (or threshold) N-dimensional proximity from one another. For example, the machine learning module 406 can classify at least a third portion of the plurality of N-dimensional representations, that is within an allowable N-dimensional proximity from the first portion, as corresponding to non-technical loss.

Similarly, the machine learning module 406 can classify one or more N-dimensional representations that are near or clustered with the second portion as corresponding to normal energy usage because they have properties (e.g., signal values) that are similar to those of the second portion. For example, the machine learning module 406 can classify at least a fourth portion of the plurality of N-dimensional representations, within the allowable N-dimensional proximity from the second portion, as corresponding to normal energy usage.

Furthermore, the machine learning module 406 can be configured to receive or acquire new signals values for the set of signals. The new signal values can be associated with changed circumstances regarding new energy usage conditions. For example, new data can be received from a particular utility meter, and the new signal values can be calculated based on the new data received. The machine learning module 406 can generate a new N-dimensional representation for the new energy usage condition based on the new signal values. For example, the new signal values can be used to generate a new point in N-dimensional space. Since the signal values and the N-dimensional representation are new, they have not yet been classified. The machine learning module 406 can classify the new N-dimensional representation based on the classifier model. For example, if the classifier model indicates that the new N-dimensional representation is similar to (or sufficiently close in N-dimensional proximity to, near, clustered with, etc.) another representation that has already been classified as corresponding to non-technical loss, then the new N-dimensional representation can be classified as corresponding to non-technical loss as well. Accordingly, the at least one machine learning algorithm can facilitate mapping, based on signal values, at least some N-dimensional representations to non-technical loss. On the other hand, if the classifier model determines that the new representation is similar to another representation classified as normal energy usage, then the new representation can be classified as normal energy usage.

In some instances, the at least one machine learning algorithm includes an unsupervised process. As such, unclassified data (e.g., new signal values) can be utilized to detect new patterns, trends, properties, and/or characteristics useful for identifying non-technical loss. For example, high density clustered N-dimensional representations can be assumed to correspond to normal usage. The unsupervised process can attempt to classify small clusters of N-dimensional representations that are outside or substantially separate from the high density clusters. If one representation in the small cluster is verified as corresponding to non-technical loss, then the entire small cluster can be classified as corresponding to non-technical loss. In some cases, manual review or confirmation can facilitate the unsupervised process.

In some cases, one or more new signal values associated with new energy usage conditions may be acquired and analyzed to continuously or periodically train the classifier model. Through either a supervised process or an unsupervised process, the new signal values can be analyzed to provide an improved understanding for more accurately identifying energy usage conditions that are likely associated with non-technical loss versus likely being normal. As new signal values indicative of non-technical loss and new signal values indicative of normal energy usage are received by the machine learning module 406, the at least one machine learning algorithm can modify the classifier model to account for the new signal values. Accordingly, the classifier model can learn, change, and improve over time. In some embodiments, the classifier model may determine that, based on their signal values, some signals for classifying energy usage conditions may not be especially relevant or important to the determination of non-technical loss. Accordingly, the energy usage identification module 400 may selectively eliminate from consideration some signals in the identification of non-technical loss.

In some embodiments, signals can be selected in order to maximize yield. In this context, yield may refer to the number of correctly identified leads relative to total leads relating to potential instances of non-technical loss. Signals may also be selected to minimize false positives. A false positive may refer to incorrectly identified instances of non-technical loss, which can result in associated costs and delay.

In some embodiments, the at least one machine learning algorithm can be associated with at least one of a support vector machine, a boosted decision tree, a classification tree, a regression tree, a bagging tree, a random forest, a neural network, or a rotational forest. It is understood that many other variations, approaches, techniques, and/or processes can be utilized.

The results processing module 408 can be configured to facilitate the processing of data, such as data resulting from the application of the at least one machine learning algorithm to the plurality of N-dimensional representations. In some embodiments, the results processing module 408 can be configured to identify a plurality of utility meters, such as gas meters, power meters, and water meters, that have likelihoods of being associated with the non-technical loss. For example, the identified meters can be associated with energy usage conditions that are represented by certain N-dimensional representations that have been classified as corresponding to non-technical loss.

Moreover, the results processing module 408 can rank the identified plurality of utility meters based on the likelihoods of being associated with the non-technical loss. For example, the results processing module 408 can generate rankings or scores for the identified meters based on their respective likelihoods of being associated with the non-technical loss. In some implementations, the likelihood for an identified meter associated with a particular energy usage condition can depend on an N-dimensional proximity between the representation associated with one energy usage condition and another representation verified as corresponding to non-technical loss. A lesser N-dimensional proximity can indicate a higher likelihood.

The results processing module 408 can further determine that at least some of the plurality of meters meet specified ranking threshold criteria and can provide the at least some of the plurality of utility meters as candidates for investigation about potential non-technical loss. In one example, the ranking threshold criteria can specify a minimum likelihood percentage amount. In another example, the ranking threshold criteria can specify a quantity having the highest likelihoods. Those ranked meters that satisfy the ranking threshold criteria can be the meters most likely to have encountered non-technical loss, such as due to theft or malfunction.

Further, as discussed previously, a new N-dimensional representation can be identified as corresponding to non-technical loss. The results processing module 408 can report the non-technical loss to one or more entities associated with the particular energy usage condition. For example, the meters determined most likely to have encountered the non-technical loss can be presented to one or more energy providers or suppliers (e.g., utility companies). The energy providers or suppliers, in turn, can investigate and resolve any problems.

In some cases, the results processing module 408 can acquire, from the one or more entities such as energy providers, at least one of a confirmation or a non-confirmation that the particular energy usage condition is associated with the non-technical loss. For example, the one or more entities can conduct a field investigation or other process to confirm the non-technical loss or the absence of non-technical loss. The entities can report its findings back to the non-technical loss identification module 400. Additionally, in some instances, the classifier model can be modified, improved, or refined based on the at least one of the confirmation or the non-confirmation.

FIG. 5 illustrates an example table 500 including example signal values for an example set of signals, in accordance with an embodiment of the present disclosure. As shown in FIG. 5, the example table 500 can show an example set of three signals, Signal A, Signal B, and Signal N. As such, the signal quantity for this example set of signals is three. It is contemplated that numerous variations are possible.

In the example of FIG. 5, Signal A is a "Consumption Drop" signal. The signal value for Signal A is calculated to be 0.82, for example. Signal B can correspond to a "Line Outage Event" signal and can have a signal value of 0.74, in this example. Signal N can be a "Cancellation of Work Order" signal with a signal value of 0.91, for example. These signal values can be associated with a particular energy usage condition. For example, these signal values can be associated with a particular utility meter at a particular time. Based on these signal values, an N-dimensional representation can be generated, which will be discussed in more detail with reference to FIG. 6.

Figure 6:
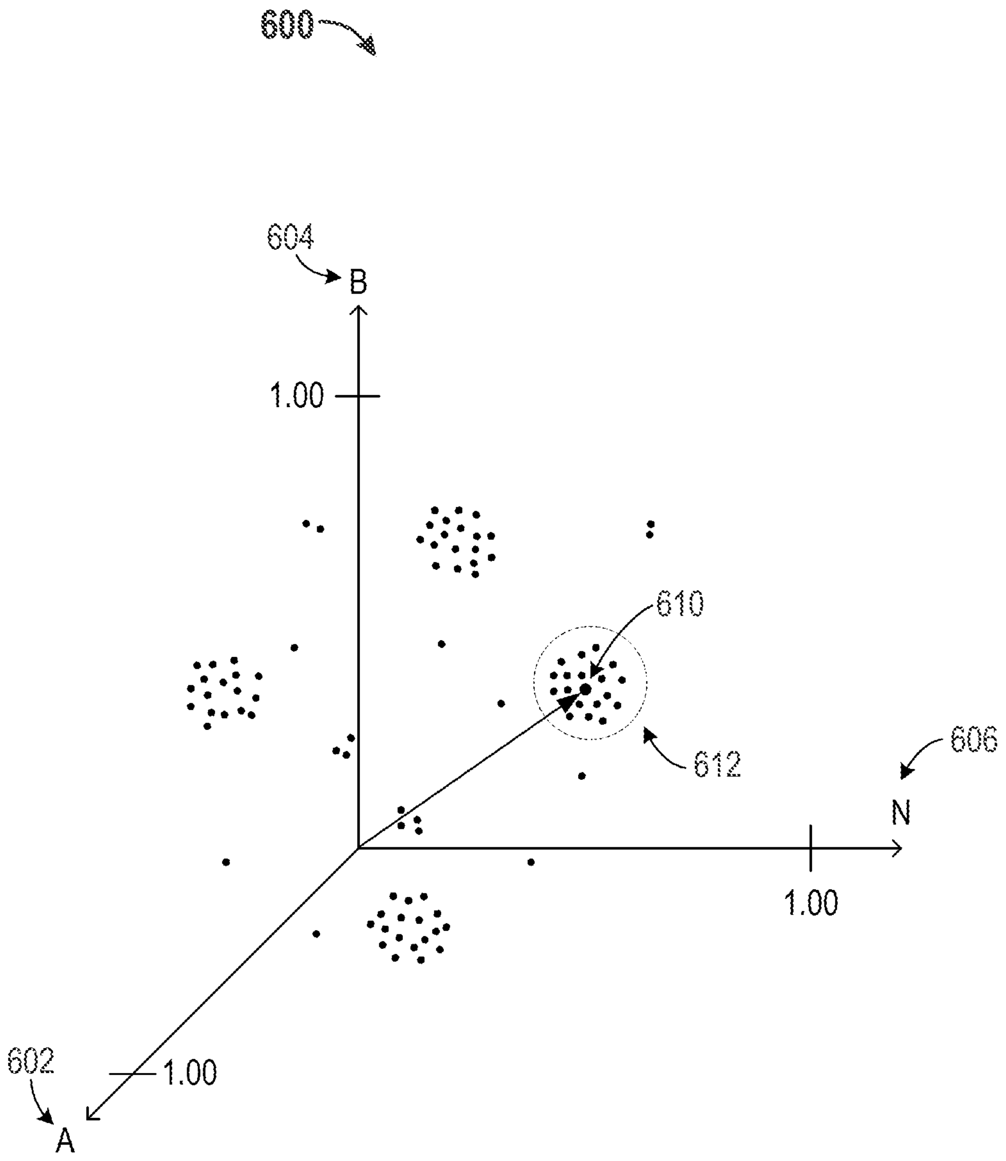
FIG. 6 illustrates an example graph including example N-dimensional representations generated based on example signal values, in accordance with an embodiment of the present disclosure.

FIG. 6 illustrates an example graph 600 including example N-dimensional representations generated based on example signal values, in accordance with an embodiment of the present disclosure. The example graph 600 can show an N-dimensional representation (e.g., a point) 610 that is generated based on the signal values for the set of signals illustrated in the example table 500 of FIG. 5.

Since the signal quantity for the set of signals in FIG. 5 is three, the number of dimensions in the example graph 600 is three (e.g., N=3). Each dimension in the N-dimensional space of FIG. 6 is associated with an axis and can correspond to a respective signal in FIG. 5. It follows that Dimension A 602 can correspond to Signal A of FIG. 5, Dimension B 604 can correspond to Signal B, and Dimension N 606 can correspond to Signal N. As such, the N-dimensional representation 610 has coordinates (A=0.82, B=0.74, N=0.91) and is presented accordingly in the example graph 600.

As shown in the example of FIG. 6, the representation 610 is within a cluster 612 including other N-dimensional representations, which can represent other energy usage conditions involving, for example, other meters. In one example, if the representation 610 is within an allowable distance from the cluster 612, then the representation can be classified according to the cluster 612. For instance, if the cluster 612 has been verified as being associated with NTL (or, alternatively, normal energy usage), then the representation 610 when located within an allowable distance from the cluster 612 likewise will be classified as being associated with NTL (or, alternatively, normal energy usage).

In another example, if it is verified that the representation 610 corresponds to non-technical loss, then the entire cluster 612 to which the representation 610 belongs can be classified as corresponding to non-technical loss (and vice versa for normal energy usage). If another representation in the cluster 612 is verified as corresponding to non-technical loss and if the representation 610 has not yet been classified, then the representation 610 (and the entire cluster 612) can be classified as corresponding to non-technical loss (and vice versa for normal energy usage). Other clusters in the example graph 600 can be classified in a similar fashion.

Furthermore, it should be appreciated that the example graph 600 of FIG. 6 is provided for illustrative purposes. In some implementations, the N-dimensional representations need not be presented in graphical or visual form.

Figure 7:
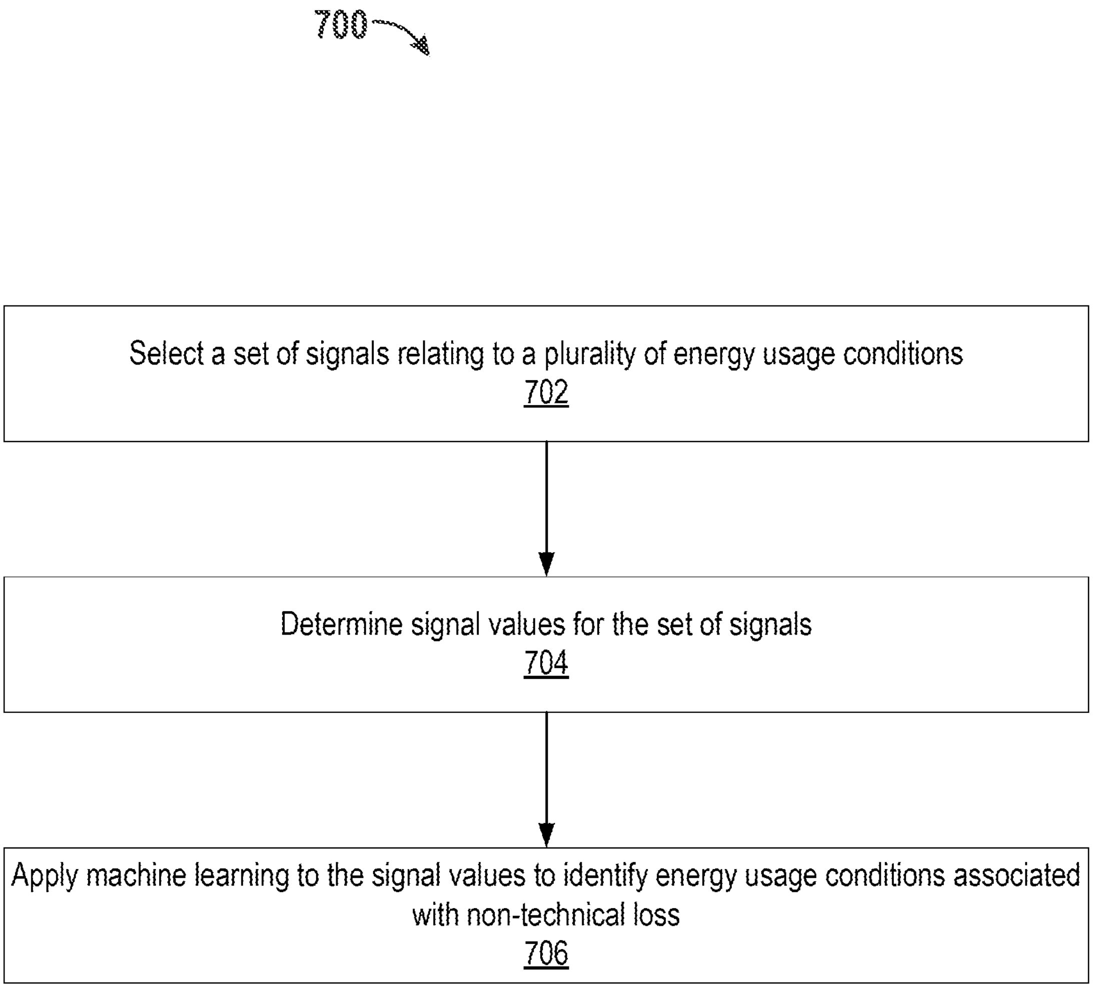
FIG. 7 illustrates an example method for utilizing machine learning to identify non-technical loss, in accordance with an embodiment of the present disclosure.

FIG. 7 illustrates an example method 700 for utilizing machine learning to identify non-technical loss, in accordance with an embodiment of the present disclosure. It should be understood that there can be additional, fewer, or alternative steps performed in similar or alternative orders, or in parallel, within the scope of the various embodiments unless otherwise stated.

At block 702, the example method 700 can select a set of signals relating to a plurality of energy usage conditions. In some cases, the set of signals can be associated with a plurality of energy usage conditions. In some implementations, the set of signals can be determined in whole or in part by an operator of the energy management platform 102. The set of signals can be stored in a library within or outside the energy management platform 102. In some instances, the set of signals can grow, shrink, and/or change over time. For example, signal quantity of the set of signals may be modified based on machine learning algorithms for classifying energy usage conditions. In some embodiments, energy providers such as utility companies can create their own signals and provide these signals to the energy management platform 102 to be utilized in addition to or instead of the set of signals determined by the operator of the energy management platform 102.

At block 704, the example method 700 can determine signal values for the set of signals. In some instances, a plurality of N-dimensional representations for the plurality of energy usage conditions can be generated based on the signal values. Moreover, each N-dimensional representation can have N-dimensions corresponding to a signal quantity of the set of signals.

At block 706, the example method 700 can apply machine learning to the signal values to identify energy usage conditions associated with non-technical loss. In some instances, application of machine learning to the signal values may involve application of at least one machine learning algorithm to the plurality of N-dimensional representations to produce a classifier model for identifying non-technical loss. In some embodiments, the classifier model can be modified, refined, and/or improved over time. Additional details of the example method 700 are discussed above and not repeated here.

It is further contemplated that there can be many other uses, applications, and/or variations associated with the various embodiments of the present disclosure.

Figure 8:
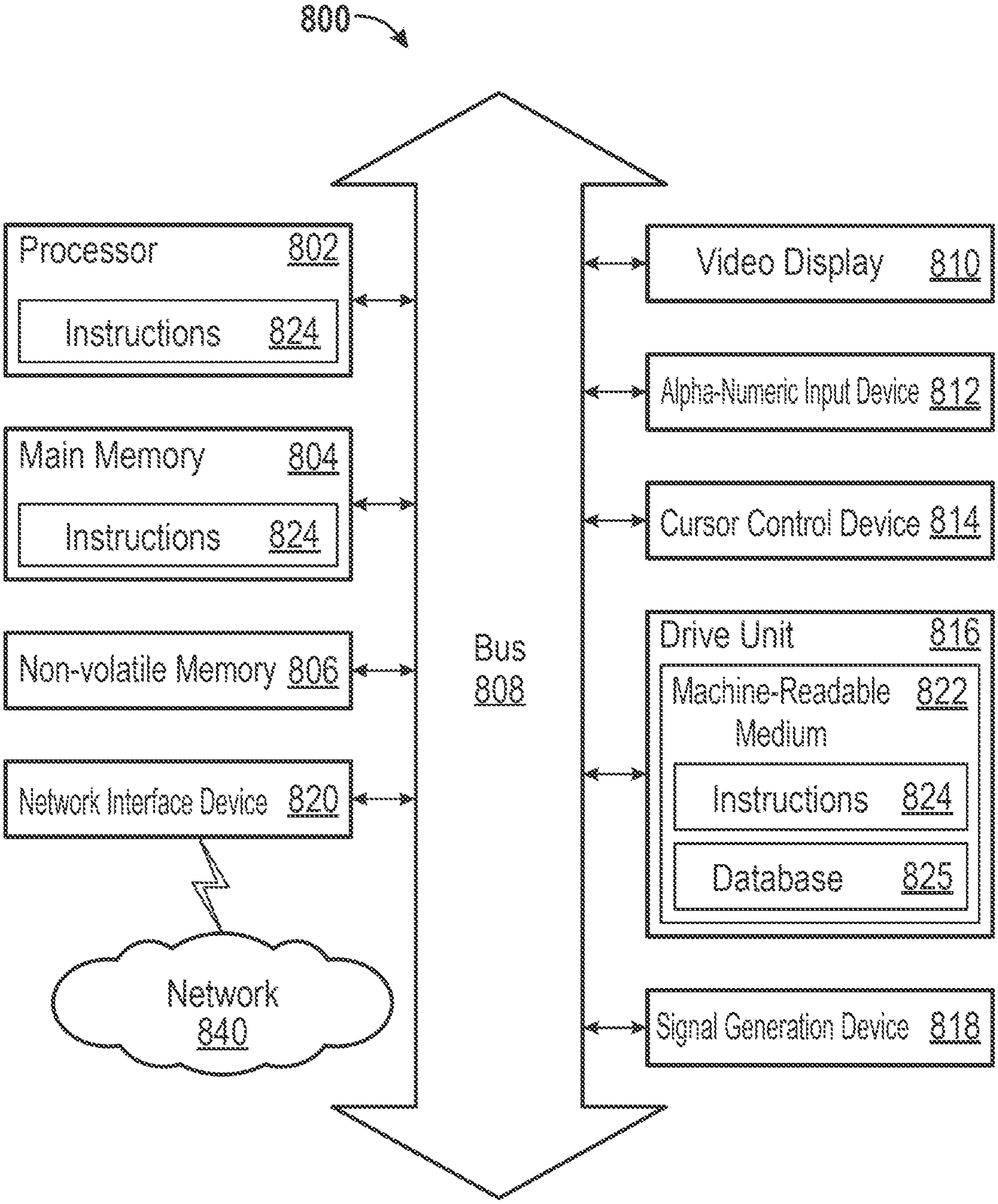
FIG. 8 illustrates an example machine within which a set of instructions for causing the machine to perform one or more of the embodiments described herein can be executed, in accordance with an embodiment of the present disclosure.

FIG. 8 illustrates an example machine 800 within which a set of instructions for causing the machine to perform one or more of the embodiments described herein can be executed, in accordance with an embodiment of the present disclosure. The machine may be connected (e.g., networked) to other machines. In a networked deployment, the machine may operate in the capacity of a server or a client machine in a client-server network environment, or as a peer machine in a peer-to-peer (or distributed) network environment.

The machine 800 includes a processor 802 (e.g., a central processing unit (CPU), a graphics processing unit (GPU), or both), a main memory 804, and a nonvolatile memory 806 (e.g., volatile RAM and non-volatile RAM), which communicate with each other via a bus 808. In some embodiments, the machine 800 can be a desktop computer, a laptop computer, personal digital assistant (PDA), or mobile phone, for example. In one embodiment, the machine 800 also includes a video display 810, an alphanumeric input device 812 (e.g., a keyboard), a cursor control device 814 (e.g., a mouse), a drive unit 816, a signal generation device 818 (e.g., a speaker) and a network interface device 820.

In one embodiment, the video display 810 includes a touch sensitive screen for user input. In one embodiment, the touch sensitive screen is used instead of a keyboard and mouse. The disk drive unit 816 includes a machine-readable medium 822 on which is stored one or more sets of instructions 824 (e.g., software) embodying any one or more of the methodologies or functions described herein. The instructions 824 can also reside, completely or at least partially, within the main memory 804 and/or within the processor 802 during execution thereof by the computer system 800. The instructions 824 can further be transmitted or received over a network 840 via the network interface device 820. In some embodiments, the machine-readable medium 822 also includes a database 825.

Volatile RAM may be implemented as dynamic RAM (DRAM), which requires power continually in order to refresh or maintain the data in the memory. Non-volatile memory is typically a magnetic hard drive, a magnetic optical drive, an optical drive (e.g., a DVD RAM), or other type of memory system that maintains data even after power is removed from the system. The non-volatile memory may also be a random access memory. The non-volatile memory can be a local device coupled directly to the rest of the components in the data processing system. A non-volatile memory that is remote from the system, such as a network storage device coupled to any of the computer systems described herein through a network interface such as a modem or Ethernet interface, can also be used.

While the machine-readable medium 822 is shown in an exemplary embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure. The term "machine-readable medium" shall accordingly be taken to include, but not be limited to, solid-state memories, optical and magnetic media, and carrier wave signals. The term "storage module" as used herein may be implemented using a machine-readable medium.

In general, the routines executed to implement the embodiments of the present disclosure can be implemented as part of an operating system or a specific application, component, program, object, module or sequence of instructions referred to as "programs" or "applications". For example, one or more programs or applications can be used to execute specific processes described herein. The programs or applications typically comprise one or more instructions set at various times in various memory and storage devices in the machine and that, when read and executed by one or more processors, cause the machine to perform operations to execute elements involving the various aspects of the embodiments described herein.

The executable routines and data may be stored in various places, including, for example, ROM, volatile RAM, non-volatile memory, and/or cache. Portions of these routines and/or data may be stored in any one of these storage devices. Further, the routines and data can be obtained from centralized servers or peer-to-peer networks. Different portions of the routines and data can be obtained from different centralized servers and/or peer-to-peer networks at different times and in different communication sessions, or in a same communication session. The routines and data can be obtained in entirety prior to the execution of the applications. Alternatively, portions of the routines and data can be obtained dynamically, just in time, when needed for execution. Thus, it is not required that the routines and data be on a machine-readable medium in entirety at a particular instance of time.

While embodiments have been described fully in the context of machines, those skilled in the art will appreciate that the various embodiments are capable of being distributed as a program product in a variety of forms, and that the embodiments described herein apply equally regardless of the particular type of machine- or computer-readable media used to actually effect the distribution. Examples of machine-readable media include, but are not limited to, recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Alternatively, or in combination, the embodiments described herein can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

For purposes of explanation, numerous specific details are set forth in order to provide a thorough understanding of the description. It will be apparent, however, to one skilled in the art that embodiments of the disclosure can be practiced without these specific details. In some instances, modules, structures, processes, features, and devices are shown in block diagram form in order to avoid obscuring the description. In other instances, functional block diagrams and flow diagrams are shown to represent data and logic flows. The components of block diagrams and flow diagrams (e.g., modules, engines, blocks, structures, devices, features, etc.) may be variously combined, separated, removed, reordered, and replaced in a manner other than as expressly described and depicted herein.

Reference in this specification to "one embodiment", "an embodiment", "other embodiments", "another embodiment", or the like means that a particular feature, design, structure, or characteristic described in connection with the embodiment is included in at least one embodiment of the disclosure. The appearances of, for example, the phrases "according to an embodiment", "in one embodiment", "in an embodiment", or "in another embodiment" in various places in the specification are not necessarily all referring to the same embodiment, nor are separate or alternative embodiments mutually exclusive of other embodiments. Moreover, whether or not there is express reference to an "embodiment" or the like, various features are described, which may be variously combined and included in some embodiments but also variously omitted in other embodiments. Similarly, various features are described which may be preferences or requirements for some embodiments but not other embodiments.

Although embodiments have been described with reference to specific exemplary embodiments, it will be evident that the various modifications and changes can be made to these embodiments. Accordingly, the specification and drawings are to be regarded in an illustrative sense rather than in a restrictive sense. The foregoing specification provides a description with reference to specific exemplary embodiments. It will be evident that various modifications can be made thereto without departing from the broader spirit and scope as set forth in the following claims. The specification and drawings are, accordingly, to be regarded in an illustrative sense rather than a restrictive sense.

Although some of the drawings illustrate a number of operations or method steps in a particular order, steps that are not order dependent may be reordered and other steps may be combined or omitted. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

It should also be understood that a variety of changes may be made without departing from the essence of the present disclosure. Such changes are also implicitly included in the description. They still fall within the scope of the present disclosure. It should be understood that this disclosure is intended to yield a patent covering numerous aspects of the disclosed technology, both independently and as an overall system, and in both method and apparatus modes.

Further, each of the various elements of the present disclosure and claims may also be achieved in a variety of manners. This disclosure should be understood to encompass each such variation, be it a variation of an embodiment of any apparatus embodiment, a method or process embodiment, or even merely a variation of any element of these.

What is claimed is:

1. A method comprising:

determining, by one or more processors, signal values for a selected set of signals relating to a plurality of energy usage conditions, wherein the selected set of signals includes a consumption drop signal corresponding to a drop in energy consumption measured by an energy meter compared to an average energy consumption measured by the energy meter;

generating, by the one or more processors based on the determined signals values, a plurality of N-dimensional representations for the plurality of energy usage conditions, wherein each N-dimensional representation corresponds to an energy usage condition and includes a dimension corresponding to a signal value determined for the consumption drop signal;

applying, by the one or more processors, a trained machine learning classifier model to the plurality of N-dimensional representations to identify energy usage conditions associated with nontechnical loss, wherein energy usage conditions associated with non-technical loss are associated with irregular energy usage;

receiving, by the one or more processors, new signal values for the selected set of signals, the new signal values being associated with a particular energy usage condition;

generating, by the one or more processors, a new N-dimensional representation for the particular energy usage condition based on the new signal values; and classifying, by the one or more processors, the new N-dimensional representation based on the trained machine learning classifier model.

2. The method of claim 1, further comprising:

applying, by the one or more processors, at least one machine learning algorithm to the plurality of N-dimensional representations to produce the classifier model for identifying nontechnical loss.

3. The method of claim 1, further comprising selecting, by the one or more processors, the selected set of signals relating to the plurality of energy usage conditions.

4. The method of claim 1, wherein N represents a number of signals in the selected set of signals.

5. The method of claim 1, wherein the trained classifier model is configured to classify, as corresponding to non-technical loss a first portion of the plurality of N-dimensional representations within an allowable N-dimensional proximity from N-dimensional representations which have been previously recognized as corresponding to non-technical loss.

6. The method of claim 5, wherein the trained classifier model is further configured to classify, as corresponding to normal energy usage, at least a second portion of the plurality of N-dimensional representations within an allowable N-dimensional proximity from N-dimensional representations which have been previously recognized as corresponding to normal energy usage.

7. The method of claim 1, wherein the trained machine learning classifier model is trained with at least one of a support vector machine, a boosted decision tree, a classification tree, a regression tree, a bagging tree, a random forest, a neural network, or a rotational forest.

8. The method of claim 1, wherein applying the trained machine learning classifier model to the plurality of N-dimensional representations to identify energy usage conditions associated with non-technical loss comprises:

identifying, by the one or more processors, a plurality of energy usage conditions that have likelihoods of being associated with non-technical loss; and ranking, by the one or more processors, the plurality of energy usage conditions based on the likelihoods of being associated with non-technical loss.

9. The method of claim 1, further comprising:

determining, by the one or more processors, that at least some of a plurality of meters meet specified ranking threshold criteria, the plurality of meters including the meter; and identifying, by the one or more processors, the at least some of the plurality of utility meters as candidates for investigation.

10. The method of claim 1, wherein one or more signals in the selected set of signals are associated with at least one of an account attribute signal category, an anomalous load signal category, a calculated status signal category, a current analysis signal category, a missing data signal category, a disconnected signal category, a meter event signal category, a monthly meter anomalous load signal category, a monthly meter consumption on inactive signal category, an outage signal category, a stolen meter signal category, an unusual production signal category, a work order signal category, or a zero reads signal category.

11. The method of claim 1, further comprising:

acquiring, by the one or more processors, a set of formulas corresponding to the selected set of signals, each formula in the set of formulas corresponding to a respective signal in the selected set of signals; and determining, by the one or more processors, the signal values for the selected set of signals based on the set of formulas.

12. The method of claim 1, wherein one or more signals in the selected set of signals is based on an analysis of active and reactive power data.

13. The method of claim 12, wherein the one or more signals based on an analysis of active and reactive power data characterize irregular variations in year-over-year consumption patterns.

14. The method of claim 1, further comprising reporting, by the one or more processors, the identified energy usage conditions associated with non-technical loss.

15. The method of claim 14, wherein reporting the identified energy usage conditions associated with non-technical loss comprises graphically rendering a report of the identified energy usage condition for presentation by a computer system.

16. A method comprising:

determining, by one or more processors, signal values for a selected set of signals relating to a plurality of energy usage conditions, wherein the selected set of signals includes a consumption drop signal corresponding to a drop in energy consumption measured by an energy meter compared to an average energy consumption measured by the energy meter;

generating, by the one or more processors, based on the determined set of signal values a plurality of N-dimensional representations for the plurality of energy usage conditions, wherein each N-dimensional representation corresponds to an energy usage condition and includes a dimension corresponding to a signal value determined for the consumption drop signal;

applying, by the one or more processors, a machine learning algorithm to the plurality of N-dimensional representations to produce a classifier model for identifying energy usage conditions associated with non-technical loss, wherein energy usage conditions associated with non-technical loss are associated with irregular energy usage;

receiving, by the one or more processors, new signal values for the selected set of signals, the new signal values being associated with a particular energy usage condition;

generating, by the one or more processors, a new N-dimensional representation for the particular energy usage condition based on the new signal values; and classifying, by the one or more processors, the new N-dimensional representation based on the classifier model.

17. The method of claim 16, wherein applying the machine learning algorithm to produce the classifier model comprises a supervised process based on a first portion of the plurality of N-dimensional representations which have been previously recognized as corresponding to non-technical loss.

18. The method of claim 17, wherein the supervised process is further based on a second portion of the plurality of N-dimensional representations that have been previously recognized as corresponding to normal energy usage.

19. The method of claim 16, wherein applying the machine learning algorithm to produce the classifier model comprises an unsupervised process.

20. The method of claim 19, wherein the unsupervised process comprises classifying high density clusters of N-dimensional representations as corresponding to normal energy usage and classifying N-dimensional representations that are substantially separate from the high density clusters as corresponding to non-technical loss.

21. The method of claim 16, further comprising: applying, by the one or more processors, the machine learning algorithm to the new N-dimensional representation to modify the classifier model.

22. A non-transitory computer readable medium storing instructions that, when executed by one or more processors, cause the one or more processors to perform operations comprising:

determining signal values for a selected set of signals relating to a plurality of energy usage conditions, wherein the selected set of signals includes a consumption drop signal corresponding to a drop in energy consumption measured by an energy meter compared to an average energy consumption measured by the energy meter;

generating, based on the determined signals values, a plurality of N-dimensional representations for the plurality of energy usage conditions, wherein each N-dimensional representation corresponds to an energy usage condition and includes a dimension corresponding to a signal value determined for the consumption drop signal;

applying a trained machine learning classifier model to the plurality of N-dimensional representations to identify energy usage conditions associated with nontechnical loss, wherein energy usage conditions associated with non-technical loss are associated with irregular energy usage;

receiving, by the one or more processors, new signal values for the selected set of signals, the new signal values being associated with a particular energy usage condition;

generating, by the one or more processors, a new N-dimensional representation for the particular energy usage condition based on the new signal values; and classifying, by the one or more processors, the new N-dimensional representation based on the trained machine learning classifier model.

23. The non-transitory computer-readable storage medium of claim 22, wherein the trained classifier model is configured to classify, as corresponding to non-technical loss a first portion of the plurality of N-dimensional representations within an allowable N-dimensional proximity from N-dimensional representations which have been previously recognized as corresponding to non-technical loss.

24. The non-transitory computer-readable storage medium of claim 22, further comprising:

determining that at least some of a plurality of meters meet specified ranking threshold criteria, the plurality of meters including the meter; and identifying the at least some of the plurality of utility meters as candidates for investigation.

25. The non-transitory computer-readable storage medium of claim 22, wherein one or more signals in the selected set of signals is based on an analysis of active and reactive power data.

26. A system comprising:

a memory; and one or more processors communicatively coupled to the memory, the one or more processors configured to:

determine signal values for a selected set of signals relating to a plurality of energy usage conditions, wherein the selected set of signals includes a consumption drop signal corresponding to a drop in energy consumption measured by an energy meter compared to an average energy consumption measured by the energy meter;

generate, based on the determined signals values, a plurality of N-dimensional representations for the plurality of energy usage conditions, wherein each N-dimensional representation corresponds to an energy usage condition and includes a dimension corresponding to a signal value determined for the consumption drop signal;

apply a trained machine learning classifier model to the plurality of N-dimensional representations to identify energy usage conditions associated with nontechnical loss, wherein energy usage conditions associated with non-technical loss are associated with irregular energy usage;

receive, by the one or more processors, new signal values for the selected set of signals, the new signal values being associated with a particular energy usage condition;

generate, by the one or more processors, a new N-dimensional representation for the particular energy usage condition based on the new signal values; and classify, by the one or more processors, the new N-dimensional representation based on the trained machine learning classifier model.

27. The system of claim 26, wherein the trained classifier model is configured to classify, as corresponding to non-technical loss a first portion of the plurality of N-dimensional representations within an allowable N-dimensional proximity from N-dimensional representations which have been previously recognized as corresponding to non-technical loss.

28. The system of claim 26, wherein the one or more processors are configured to:

determine that at least some of a plurality of meters meet specified ranking threshold criteria, the plurality of meters including the meter; and identify the at least some of the plurality of utility meters as candidates for investigation.

29. The system of claim 26, wherein one or more signals in the selected set of signals is based on an analysis of active and reactive power data.

* * * * *